(12) United States Patent
Kodama et al.

(10) Patent No.: US 8,592,942 B2
(45) Date of Patent: Nov. 26, 2013

(54) NON-VOLATILE SEMICONDUCTOR MEMORY DEVICE

(75) Inventors: Noriaki Kodama, Kanagawa (JP);
Kenichi Hidaka, Kanagawa (JP);
Hiroyuki Kobatake, Kanagawa (JP);
Takuji Onuma, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 605 days.

(21) Appl. No.: 12/320,102

(22) Filed: Jan. 16, 2009

(65) Prior Publication Data

US 2009/0184350 A1    Jul. 23, 2009

(30) Foreign Application Priority Data

Jan. 18, 2008 (JP) ................. 2008-009509
Apr. 30, 2008 (JP) ................. 2008-118638
Dec. 10, 2008 (JP) ................. 2008-314894

(51) Int. Cl.
*H01L 27/11* (2006.01)

(52) U.S. Cl.
USPC .................. 257/530; 257/209; 257/E29.166

(58) Field of Classification Search
USPC .............. 257/530, E29.166, E29.345, 209, 257/E21.662, 50, 903; 438/131, 467, 600, 438/957, 276, 289; 365/225.7, 185.17, 365/189.09, 189.03
See application file for complete search history.

(56) References Cited

U.S. PATENT DOCUMENTS

| | | | |
|---|---|---|---|
| 4,502,208 A | | 3/1985 | McPherson |
| 4,943,538 A | * | 7/1990 | Mohsen et al. ............. 438/215 |
| 6,190,967 B1 | * | 2/2001 | Maeda et al. ............. 438/257 |
| 6,667,902 B2 | * | 12/2003 | Peng ............. 365/182 |
| 6,774,439 B2 | | 8/2004 | Fukuzumi et al. |
| 6,798,693 B2 | | 9/2004 | Peng |
| 6,819,592 B2 | * | 11/2004 | Noguchi et al. ......... 365/185.17 |
| 7,324,400 B2 | * | 1/2008 | Parks ............. 365/225.7 |
| 7,402,855 B2 | * | 7/2008 | Kurjanowicz ............. 257/288 |

(Continued)

FOREIGN PATENT DOCUMENTS

| | | |
|---|---|---|
| JP | H10-112505 (A) | 4/1998 |
| JP | 2001-308283 | 11/2001 |
| JP | 2003-179132 (A) | 6/2003 |

OTHER PUBLICATIONS

IEDM2006 (International Electron Devices Meeting), USA Institute of Electrical and Electronic Engineers (IEEE), 2006, p. 24.

(Continued)

*Primary Examiner* — Cuong Q Nguyen
*Assistant Examiner* — Yosef Gebreyesus
(74) *Attorney, Agent, or Firm* — McGinn Intellectual Property Law Group, PLLC

(57) ABSTRACT

A non-volatile semiconductor memory device having a memory cell in which operating potentials are few and the scale of the peripheral circuitry is reduced includes a select transistor having a source/drain on both sides of a channel of a semiconductor substrate and having a gate electrode disposed on the channel via a thick gate insulating film; an element isolation region formed on the semiconductor substrate in an area adjacent to the select transistor; an antifuse adjacent to the element isolation region, having a lower electrode formed on the semiconductor substrate and having an upper electrode disposed on the semiconductor substrate in an area between the element isolation region and lower electrode via a thin gate insulating film; and a connection contact electrically connecting the source and upper electrode and contacting the source and the upper electrode.

23 Claims, 27 Drawing Sheets

(56) References Cited

U.S. PATENT DOCUMENTS

| | | | |
|---|---|---|---|
| 7,755,162 B2 * | 7/2010 | Kurjanowicz et al. | 257/530 |
| 2002/0151134 A1 * | 10/2002 | Kunikiyo | 438/254 |
| 2003/0107133 A1 | 6/2003 | Tomita | |
| 2004/0004298 A1 * | 1/2004 | Madurawe | 257/903 |
| 2004/0232446 A1 * | 11/2004 | Nishimura et al. | 257/202 |
| 2006/0203591 A1 * | 9/2006 | Lee | 365/225.7 |
| 2006/0244099 A1 * | 11/2006 | Kurjanowicz | 257/530 |
| 2006/0292754 A1 * | 12/2006 | Min et al. | 438/131 |
| 2009/0108400 A1 * | 4/2009 | Cestero et al. | 257/530 |

OTHER PUBLICATIONS

Chinese Office Action dated May 19, 2011, with partial English translation.

Japanese Notice of Grounds for Rejection dated Aug. 27, 2013, with partial English-language translation.

* cited by examiner

FIG. 3

(FIRST EXEMPLARY EMBODIMENT)

|  | (SELECT) | (NON-SELECT) | (SELECT) | (NON-SELECT) |  |
|---|---|---|---|---|---|
|  | Vbl1 | Vbl2 | Vwr1 | Vwr2 | Vsource |
| WRITE | VPP | 0 | VPP | 0 | 0 |
| READ | VddIO | 0 | VddIO | 0 | 0 |

FIG. 6

(SECOND EXEMPLARY EMBODIMENT)

| | (SELECT) Vbl1 | (NON-SELECT) Vbl2 | (SELECT) Vwr1 | (NON-SELECT) Vwr2 | Vcap | Vsource |
|---|---|---|---|---|---|---|
| WRITE | VPP/2 →0 | 0 | VPP →0 | 0 | 0→ VPP/2 | Vsource |
| READ | VddIO | 0 | VddIO | 0 | VddIO | 0 |

FIG. 10 (RELATED ART)

| | (SELECT) | (NON-SELECT) | (SELECT) | (NON-SELECT) | (SELECT) | (NON-SELECT) |
|---|---|---|---|---|---|---|
| | Vbl1 | Vbl2 | Vwr1 | Vwr2 | Vwp1 | Vwp2 |
| WRITE | 0 | VPP/2 | VPP/2 | 0 | VPP | 0 |
| READ | 0 | Vdd | Vdd | 0 | VddIO | 0 |

FIG. 11 (FOURTH EXEMPLARY EMBODIMENT) X-X'

FIG. 13 (FIFTH EXEMPLARY EMBODIMENT)

FIG. 15

(FIFTH EXEMPLARY EMBODIMENT)

| | SELECT | NON-SELECT | SELECT | NON-SELECT | | | |
|---|---|---|---|---|---|---|---|
| | Vbl1 | Vbl2 | Vwr1 | Vwr2 | Pwell | Vsource | Nwell |
| WRITE | VPP | 0 | VPP | 0 | 0 | −VPP | 0 |
| READ | VddIO | 0 | VddIO | 0 | 0 | 0 | 0 |

FIG. 16 (SIXTH EXEMPLARY EMBODIMENT)

FIG. 18

(SIXTH EXEMPLARY EMBODIMENT)

|  | SELECT | NON-SELECT | SELECT | NON-SELECT |  |  |  |
|---|---|---|---|---|---|---|---|
|  | Vbl1 | Vbl2 | Vwr1 | Vwr2 | Nwell | Vsource | Pwell |
| WRITE | VPP | 0 | VPP | 0 | VPP | 0 | 0 |
| READ | VddIO | 0 | VddIO | 0 | VddIO | 0 | 0 |

FIG. 20 (SEVENTH EXEMPLARY EMBODIMENT)

| | SELECT | NON-SELECT | SELECT | NON-SELECT | NON-SELECT | SELECT | NON-SELECT | | |
|---|---|---|---|---|---|---|---|---|---|
| | Vbl1 | Vbl2 | Vwr1 | Vwr2 | Vwr3 | Vsource (1, 2) | Vsource (3, 4) | Nwell | Pwell |
| WRITE | VPP | 0 | Vwr1 | VPP | VPP | 0 | open | VPP | 0 |
| READ | VddIO | 0 | 0 | VddIO | VddIO | 0 | 0 | VddIO | 0 |

FIG. 22

(EIGHTH EXEMPLARY EMBODIMENT)

|  | SELECT | NON-SELECT | SELECT | NON-SELECT | SELECT | NON-SELECT |  |  |
| --- | --- | --- | --- | --- | --- | --- | --- | --- |
|  | Vbl1 | Vbl2 | Vwr1 | Vwr2 | Nwell (1) | Nwell (2) | Vsource | Pwell |
| WRITE | VPP | 0 | Vwr1 | VPP | VPP | 0 | 0 | 0 |
| READ | VddIO | 0 | 0 | VddIO | VddIO | 0 | 0 | 0 |

FIG. 23 (FIRST MODIFIED EXAMPLE)

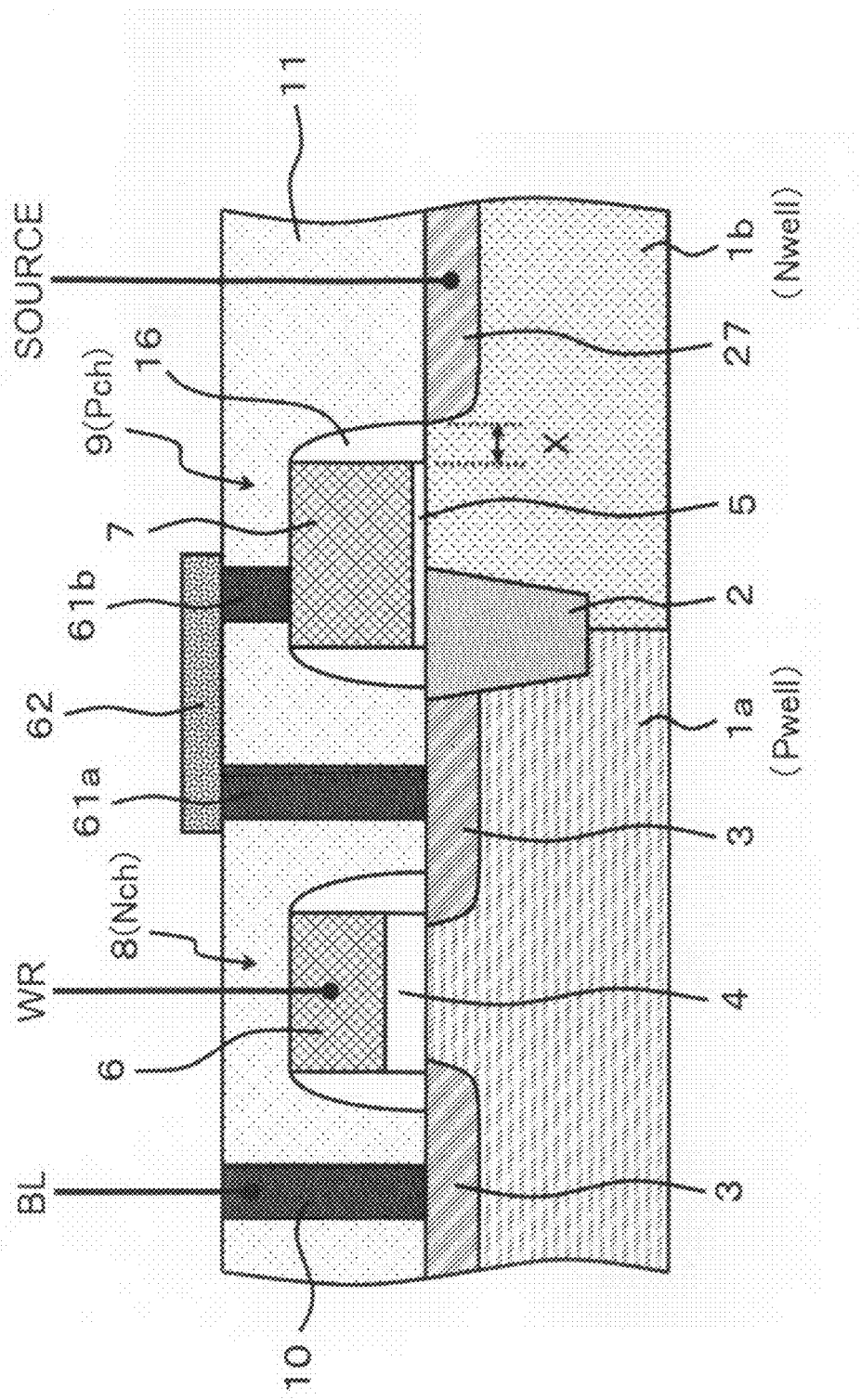
FIG. 26 (THIRD MODIFIED EXAMPLE)

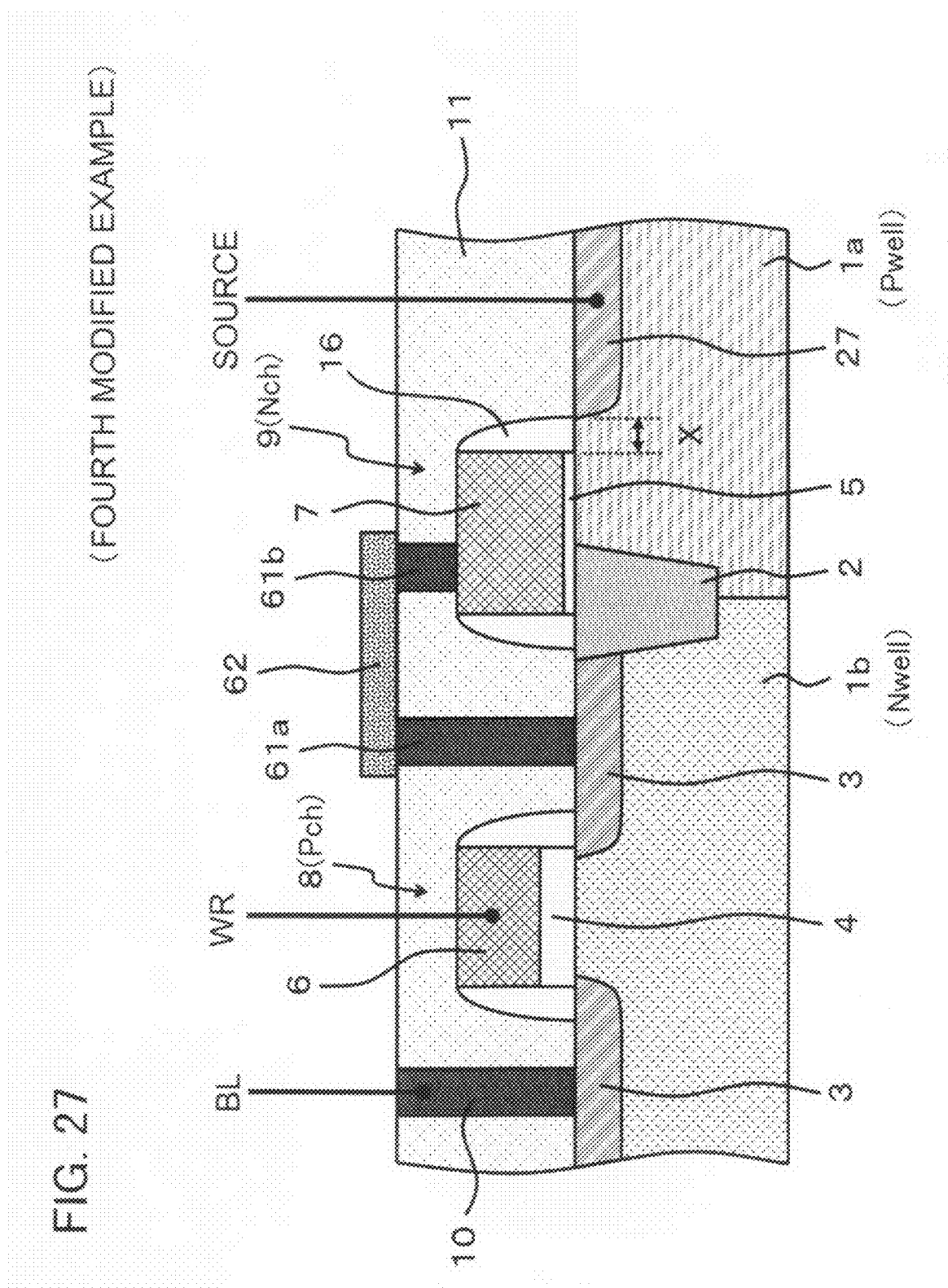
FIG. 27 (FOURTH MODIFIED EXAMPLE)

NON-VOLATILE SEMICONDUCTOR MEMORY DEVICE

FIELD OF THE INVENTION

Reference to Related Application

This application is based upon and claims the benefit of the priority of Japanese patent applications No. 2008-009509 filed on Jan. 18, 2008, No. 2008-118638 filed on Apr. 30, 2008, and No. 2008-314894 filed on Dec. 10, 2008, the disclosures of which are incorporated herein in their entirety by reference thereto.

This invention relates to a non-volatile semiconductor memory device having an antifuse-type memory cell.

BACKGROUND

There is increasing need for small-capacity non-volatile ROMs in storing security codes in LSI (Large-Scale Integration) oriented toward digital appliances and mobile telephones and for trimming gradation adjustment parameters in LCDs (Liquid Crystal Displays) and temperature parameters in control of TCXOs (Temperature-Compensated Crystal Oscillators). In a non-volatile ROM, there are many cases in which a separate chip of an EEPROM (Electronically Erasable and Programmable Read-Only Memory) is mounted by an SIP (System in Package). In recently disclosed techniques, a non-volatile ROM can be formed through a standard CMOS (Complementary Metal-Oxide Semiconductor) process that does not include additional steps. For example, antifuse-type memories are disclosed in Patent Documents 1, 2 and Non-Patent Document 1, etc.

For example, as illustrated in FIG. 8, an antifuse memory has a select transistor 108 in which N+ source/drain diffusion layers 103 are formed on both sides of the channel of a P-type semiconductor substrate 101 and a gate electrode 106 is formed on the channel via a thick gate insulating film 104. The memory further includes an antifuse 109 in the area adjacent to the select transistor 108. The antifuse 109 has a fuse upper electrode 107, which comprises polysilicon, formed via a thin gate insulating film 105 thinner than the thick gate insulating film 104 on the semiconductor substrate 101 between a fuse lower-electrode diffusion layer 127 connected to one of the source/drain diffusion layers 103 and an element isolation region 102 formed in the semiconductor substrate 101. The other source/drain diffusion layer 103 is electrically connected to a bit line BL via a bit contact 110 buried in a hole formed in an interlayer insulating film 111. The gate electrode 106 is electrically connected to a word line WR, and the fuse upper electrode 107 is electrically connected to a plate line WP.

The write operation of this type of antifuse memory cell is performed by breaking down the thin gate insulating film 105 of the antifuse 109. When the thin gate insulating film 105 is broken down by applying a high positive potential to the N+ fuse lower-electrode diffusion layer 127 that will become the lower electrode of the antifuse 109, insulation breakdown is induced while hot carriers due to avalanche breakdown or a band-to-band tunnel, etc., are injected into the thin gate insulating film 105. As a result, breakdown time is unstable, variations tend to occur and reliability tends to decline. For this reason, the applied potential is set so as to suppress the generation of hot carriers from the vicinity of the source/drain diffusion layer 103 at the time of breakdown of the thin gate insulating film 105.

For example, in a case where a memory cell is selected/non-selected in a write operation, as shown in FIG. 9, a potential Vwp1 of a select plate line WP1 in a select memory cell 113 is made a high positive breakdown potential VPP, a potential Vwr1 of a select word line WR1 is made VPP/2 and a potential Vb11 of a select bit line BL1 is made 0 V, whereby the thin gate insulating film 105 is broken down without applying potential to the fuse lower-electrode diffusion layer 127. In a non-select memory cell 114, a potential Vb12 of a non-select bit line BL2 is made VPP/2 and a suppressed potential is applied so as not to cause gate breakdown of the antifuse.

In the case of a read operation, it is important in terms of reliability that the current that flows through the antifuse of the select memory cell 113 be made to have the same direction as that of the write operation. However, readout of the select memory cell 113 is performed by placing the potential Vwp1 of the select plate line WP1 at a power supply potential VddIO of an IO unit, placing the potential Vwr1 of the select word line WR1 of the select transistor at the power supply potential Vdd, placing the potential Vb11 of the select bit line BL1 at 0 V and placing the potential Vb12 of the non-select bit line BL2 at Vdd which is the same as that of the select word line WR1 in such a manner that electrons will flow from the upper electrode of the antifuse into the bit line via the lower electrode and select transistor.

[Patent Document 1] U.S. Pat. No. 6,798,693
[Patent Document 2] Japanese Patent Kokai Publication No. JP-P2001-308283A
[Non-Patent Document 1] Bernard Aronson (Kilopass), "A Novel embedded OTPNVM Using Standard Foundry CMOS Logic Technology", IEDM2006 (International Electron Devices Meeting), USA, Institute of Electrical and Electronic Engineers (IEEE), 2006, p. 24.

SUMMARY OF THE DISCLOSURE

The entire disclosures of Patent Documents 1, 2 and Non-Patent Document 1 are incorporated herein by reference thereto.

The following analysis has been made in view of the present invention.

In the examples of the conventional art (see FIGS. 8 to 10), however, the three potentials VPP, VPP/2, 0 V are required in the write operation and the three potentials VddIO, Vdd, 0 V are required in the read operation. Thus, cell operation requires a total of five potentials, the peripheral control circuitry is complicated and the circuitry is large in scale.

The present invention seeks to provide a non-volatile semiconductor memory device having a memory cell in which the member of operating potential levels is small and the scale of the peripheral circuitry can be reduced.

In a first aspect of the present invention, there is provided a non-volatile semiconductor memory device having an antifuse memory cell, wherein the device comprises: a select transistor having source and drain regions (termed "source/drain region(s)" hereinafter) on both sides on a channel of a semiconductor substrate and having a gate electrode over the channel via a first gate insulating film; an element isolation region formed on the semiconductor substrate in an area adjacent to the select transistor; an antifuse adjacent to the element isolation region, having a lower electrode formed on the semiconductor substrate and having an upper electrode on the semiconductor substrate in an area between the element isolation region and lower electrode via a second gate insulating film; and a connection contact electrically connecting the source/drain regions and upper electrode and contacting said one of the source/drain regions and the upper electrode. Typically the one of the source/drain regions comprises a source region forming a source.

In a second aspect of the present invention, there is provided a non-volatile semiconductor memory device having an antifuse memory cell, wherein the device comprises: an antifuse; a select transistor electrically connected to one end of the antifuse; and a controller for exercising control in such a manner that a potential capable of breaking down the antifuse is applied to one end of the antifuse from the side of the select transistor at the time of a write operation.

In a third aspect of the present invention, there is provided a non-volatile semiconductor memory device having an antifuse memory cell, wherein the device comprises: a plurality of matrix-arranged memory cells to form a memory cell array in which a source/drain region of a select transistor and an upper electrode on an antifuse are connected via a connection contact; a plurality of word lines electrically connected to gate electrodes of each of the select transistors in a row direction; a plurality of bit lines electrically connected to drains of each of the select transistors in a column direction; and a source line electrically connected to lower electrodes of the antifuses at least between adjacent cells. Typically, the source/drain region refers to a source region to provide a source.

The meritorious effects of the present invention are summarized as follows.

In accordance with the present invention, at the time of a write operation, it is unnecessary to apply a breakdown suppression potential to a non-select bit line or word line, a suppression potential is not required for controlling memory cell operation and operation is simple owing to a small number of operating potentials. This makes it possible to reduce the scale of peripheral circuitry.

Other features and advantages of the present invention will be apparent from the following description taken in conjunction with the accompanying drawings, in which like reference characters designate the same or similar parts throughout the figures thereof.

BRIEF DESCRIPTIONS OF THE DRAWINGS

FIG. 3 is a table illustrating potentials at write and read of each wire of the non-volatile semiconductor memory device according to the first exemplary embodiment;

FIG. 6 is a table illustrating potentials at write and read of each wire of the non-volatile semiconductor memory device according to the second exemplary embodiment;

FIG. 10 is a table illustrating potentials at write and read of each wire of a non-volatile semiconductor memory device according to a conventional art for comparative analysis;

FIG. 15 is a table illustrating potentials at write and read of each wire of the non-volatile semiconductor memory device according to the fifth exemplary embodiment;

FIG. 18 is a table illustrating potentials at write and read of each wire of the non-volatile semiconductor memory device according to the sixth exemplary embodiment;

FIG. 20 is a table illustrating potentials at write and read of each wire of the non-volatile semiconductor memory device according to the seventh exemplary embodiment;

FIG. 22 is a table illustrating potentials at write and read of each wire of the non-volatile semiconductor memory device according to the eighth exemplary embodiment.

FIG. 26 is a partial sectional view schematically illustrating a modified variance of the configuration of a memory cell in a non-volatile semiconductor memory device according to the fifth exemplary embodiment.

FIG. 27 is a partial sectional view schematically illustrating a modified variance of the configuration of a memory cell in a non-volatile semiconductor memory device according to the sixth exemplary embodiment.

PREFERRED MODES OF THE INVENTION

Figure 1:
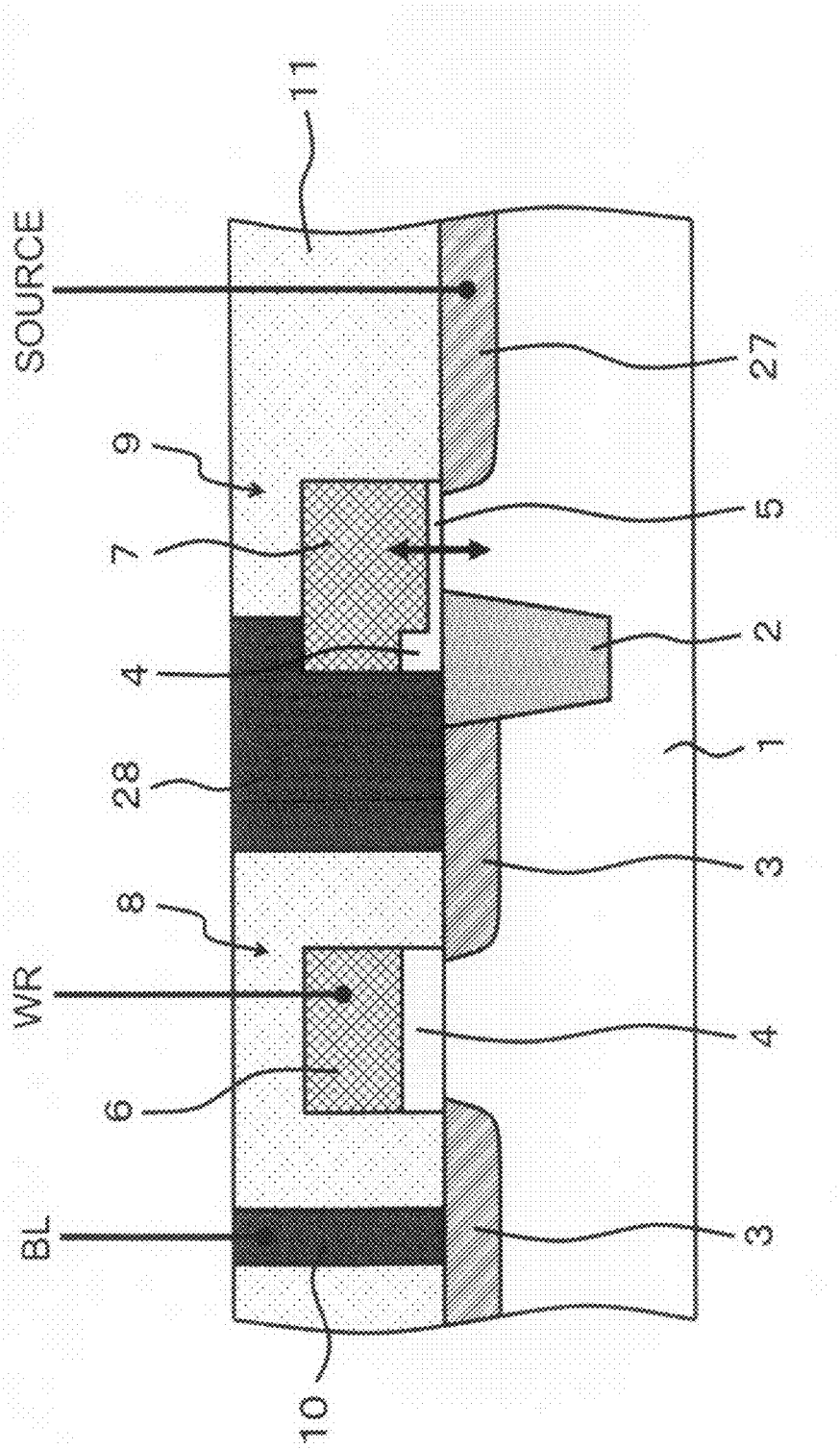
FIG. 1 is a partial sectional view schematically illustrating a configuration of a memory cell in a non-volatile semiconductor memory device according to a first exemplary embodiment of the present invention.

A non-volatile semiconductor memory device according to an exemplary embodiment of the present invention comprises: a select transistor 8 (FIG. 1) having a source (region) and drain (region) 3 (FIG. 1) on both sides of a channel of a semiconductor substrate 1 (FIG. 1) and having a gate electrode 6 (FIG. 1) disposed on the channel via a first gate insulating film 4 (FIG. 1); an element isolation region 2 (FIG. 1) formed in the semiconductor substrate 1 (FIG. 1) in an area adjacent to the select transistor 8 (FIG. 1); an antifuse 9 (FIG. 1) adjacent to the element isolation region 2 (FIG. 1), having a lower electrode 27 (FIG. 1) formed on the semiconductor substrate 1 (FIG. 1) and having an upper electrode 7 (FIG. 1) on the semiconductor substrate 1 (FIG. 1) in an area between the element isolation region 2 (FIG. 1) and lower electrode 27 (FIG. 1) via a second gate insulating film 5 (FIG. 1); and a connection contact 28 (FIG. 1) electrically connecting the source 3 (FIG. 1) and upper electrode 7 (FIG. 1) and contacting the source 3 (FIG. 1) and the upper electrode 7 (FIG. 1). The source regions and drain region may be termed as "source/drain region(s)", in general.

In the device according to the first aspect, the connection contact may be formed in a single opening that is formed in an interlayer insulating film, which has been formed over the select transistor and the antifuse, and that includes part of the source/drain region and part of the upper electrode as a wall portion of the opening.

The connection contact may comprise: a first connection contact formed in a first opening that is formed in an interlayer insulating film, which has been formed to cover the select transistor and the antifuse, and that includes exposed part of the source/drain regions; a second connection contact formed in a second opening that is formed in the interlayer insulating film and that includes part of the upper electrode as part of opening wall; and wiring for electrically connecting the first connection contact and the second connection contact.

The first gate insulating film and the second gate insulating film may be gate insulating films having a same film thickness.

The second gate insulating film may be thinner than the first gate insulating film.

The lower electrode may be a diffusion layer in which impurity of the same conductivity type as that of diffusion layer of the source/drain regions has been introduced.

The lower electrode may be of an impurity having a conductivity type different from that of the diffusion layer of the source/drain regions.

The lower electrode may be horizontally not overlapping with the upper electrode as viewed in a direction perpendicular to the substrate.

Lower electrodes of memory cells, each of which includes the select transistor and the antifuse, may be electrically connected to a common source line.

The select transistor may be of an N-channel-type.

The select transistor may be of a P-channel-type.

The device may further comprise a controller for exercising control in such a manner that when a write operation is performed, the semiconductor substrate and lower electrode are placed at a positive potential and the drain region and gate electrode are placed at ground potential.

The device may further comprise a controller for exercising control in such a manner that when a read operation is performed, the semiconductor substrate and lower electrode are placed at ground potential and the drain region and gate electrode are placed at a positive potential.

The select transistor may be of an N-channel-type and may be constructed on a P-well that has been formed in the semiconductor substrate; and the antifuse may be of a P-channel-type and may be constructed on an N-well that has been formed in the semiconductor substrate.

The device may further comprise a controller for exercising control in such a manner that when a write operation is performed, the P-well of the select transistor and the N-well of the antifuse are placed at ground potential, the lower electrode of the antifuse is placed at a negative potential and the drain region and gate electrode of the select transistor are placed at a positive potential.

The select transistor may be of a P-channel-type and may be constructed on an N-well that has been formed in the semiconductor substrate; and the antifuse may be of an N-channel-type and may be constructed on a P-well that has been formed in the semiconductor substrate.

[First Exemplary Embodiment]

A non-volatile semiconductor memory device according to according to a first exemplary embodiment of the present invention will now be described with reference to the drawings, in which FIG. 1 is a partial sectional view schematically illustrating a configuration of a memory cell in a non-volatile semiconductor memory device according to a first exemplary embodiment of the present invention.

The memory cell in the non-volatile semiconductor memory device according to according to the first exemplary embodiment has a select transistor 8 and an antifuse 9.

The select transistor 8 includes an N+ source/drain diffusion layer 3 formed on both sides of the channel of a P-type semiconductor substrate 1, and a gate electrode 6 formed over the channel via a thick gate insulating film 4. One of the source/drain diffusion layers (source/drain regions) 3 is electrically connected to a fuse upper electrode 7 of the antifuse 9 via a connection contact 28 buried in a hole formed in an interlayer insulating film 11. The other source/drain diffusion layer (source/drain regions) 3 is electrically connected to a bit line BL via a bit contact 10 buried in a hole formed in the interlayer insulating film 11. The gate electrode 6 is electrically connected to a word line WR.

The antifuse 9 is a storage node (or storage unit) in which data can be written by causing a thin gate insulating film 5 to undergo insulation breakdown so as to short-circuit the semiconductor substrate 1 and fuse upper electrode 7. The antifuse 9 is formed in an area adjacent to an STI (Shallow Isolation Trench)-type element isolation region 2 formed in the semiconductor substrate 1 in an area adjacent to one of the source/drain layers 3 of the select transistor 8. The antifuse 9, which has the structure of a MOS transistor, has the fuse upper electrode 7 of polysilicon formed via a thin gate insulating film 5, which is thinner than a thick gate insulating film 4, on the semiconductor substrate 1 in an area between an N+ fuse lower-electrode diffusion layer 27 and the element isolation region 2 formed on the semiconductor substrate 1. The fuse upper electrode 7 (one end of the antifuse) is electrically connected to one of the source/drain layers 3 of the select transistor 8 via a connection contact 28 buried in a hole formed in the interlayer insulating film 11. The fuse lower-electrode diffusion layer 27 (the other end of the antifuse) is electrically connected to a common source line SOURCE.

The thin gate insulating film 5 underlying the fuse upper electrode 7 may have a film thickness the same as that of the thick gate insulating film 4 on the element isolation region 2.

The connection contact 28 is a conductor (e.g., tungsten) buried in a hole (a single opening that includes part of the source/drain layer 3 and part of the fuse upper electrode 7) formed in the interlayer insulating film 11 formed over the select transistor 8 and antifuse 9. The connection contact 28 is arranged to bridge one of the source/drain layers 3 of the select transistor 8 and the fuse upper electrode 7 of the antifuse 9 and extends continuously from part of the surface of this one source/drain layer 3 to part of the surface of the fuse upper electrode 7 to thereby bring this one source/drain layer 3 and the fuse upper electrode 7 into contact.

It should be noted that although the fuse lower-electrode diffusion layer 27 of the antifuse 9 is obtained by diffusing an N+ impurity into the P-type semiconductor substrate 1, it may just as well be obtained by diffusing a P+ impurity in the P-type semiconductor substrate 1. If the fuse lower-electrode diffusion layer 27 is obtained by diffusing a P+ impurity in the P-type semiconductor substrate 1, an advantage is that the resistance of the antifuse portion can be reduced. Further, although the select transistor 8 has been described assuming an N-channel-type memory cell, similar effects would be obtained also with a P-channel-type memory cell.

Figure 23:
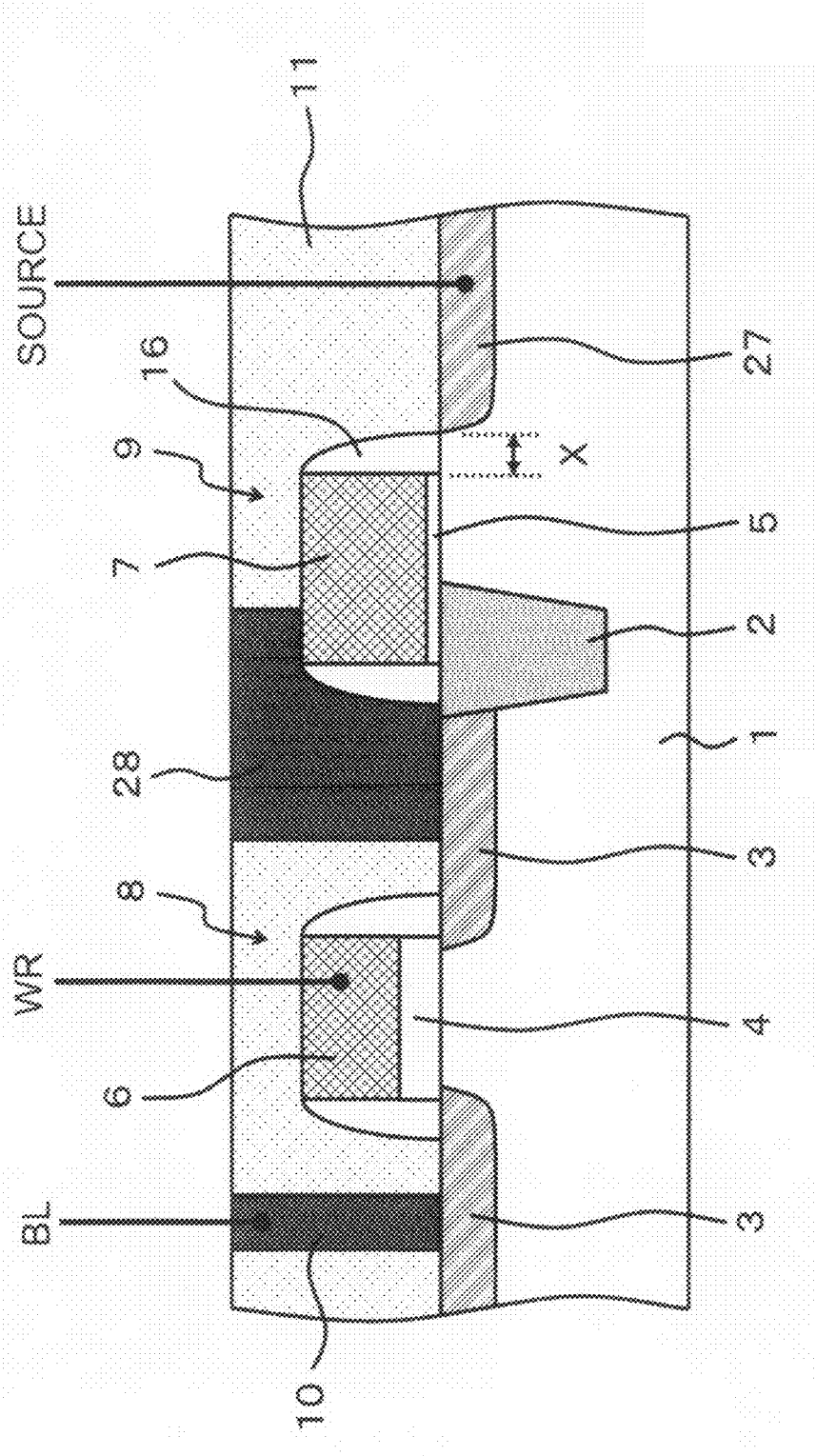
FIG. 23 is a partial sectional view schematically illustrating a modified variance of the configuration of a memory cell in a non-volatile semiconductor memory device according to the first exemplary embodiment.
Figure 24:
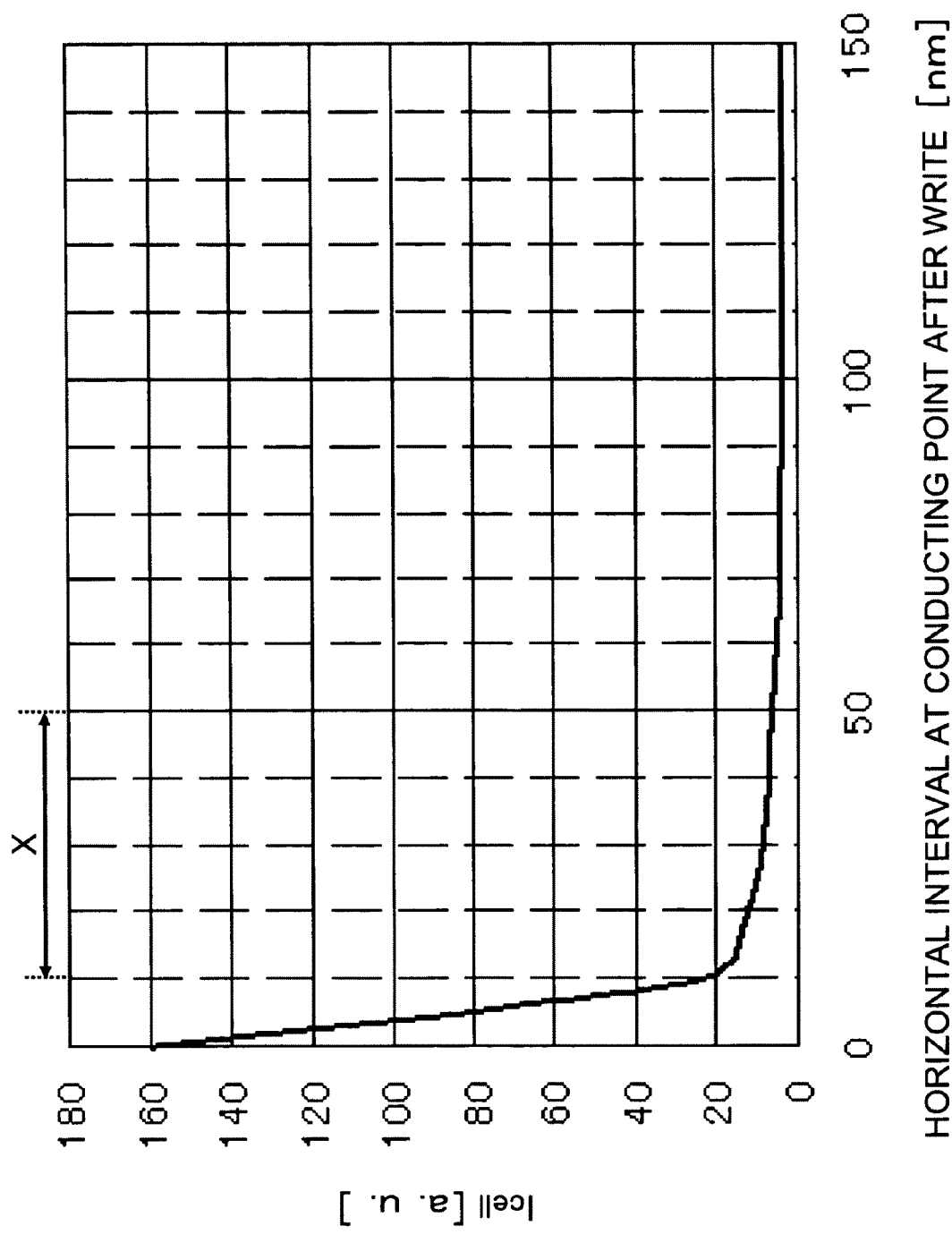
FIG. 24 is a graph schematically illustrating relationship of a horizontal interval at a conducting point on an antifuse of a memory cell, and current amount after write.

It is preferable to arrange the antifuse 9 so as to place the upper electrode 7 apart from the lower electrode 27 (to a horizontal direction of the figure) (refer to FIG. 23). That is, preferably, the lower electrode 7 is placed not horizontally overlapping with the upper electrode 27. This configuration can be achieved by masking to suppress LDD (Lightly Doped Drain) implantation or extension implantation such that the upper electrode 7 is set apart (offset) from the lower electrode 27 at an interval x (e.g.,) of the sidewall 16, during a usual process of manufacturing CMOS. With this configuration, the read current can be made more stable. FIG. 24 shows the relationship of the horizontal interval (equal to the interval x in FIG. 23 when conducted at the portion closest to the lower electrode 27) between a junction position of the electrode 27 on a circuit face and a conducting point formed after write, and the current amount (I cell) between the upper electrode 7 and the lower electrode 27 after write. When the interval x is too narrow, the current of I cell becomes extremely increased. Thus, it is preferable to set the interval x not less than 10 nm to make I cell stable. On the other hand, when the interval x is so wide to constitute an offset-transistor, there is a disadvantage that the current of I cell is decreased remarkably. Accordingly, the interval x is desired to be set 10 nm to 50 nm.

Figure 2:
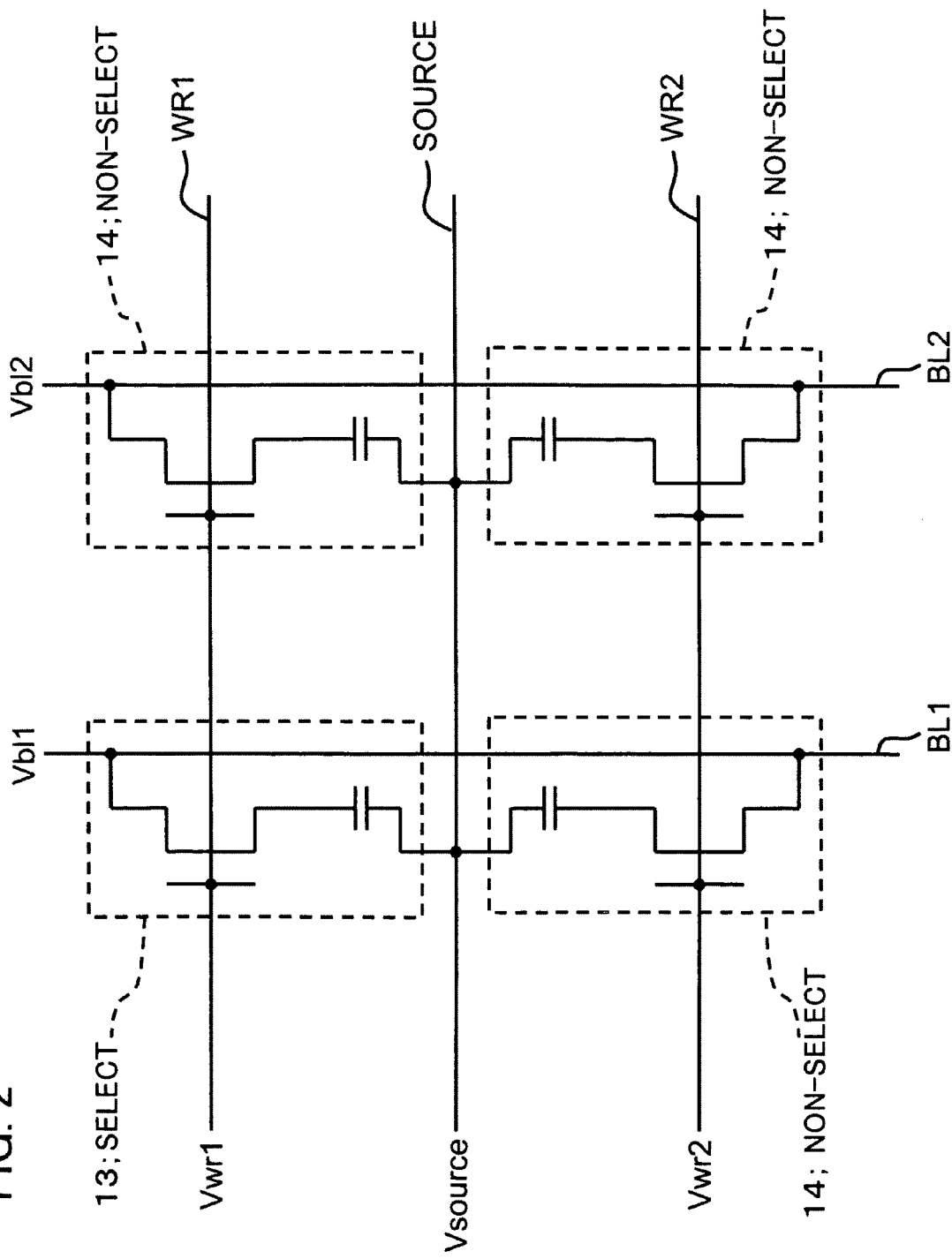
FIG. 2 is a circuit diagram schematically illustrating a configuration of a non-volatile semiconductor memory device according to the first exemplary embodiment.

Memory cells (a set thereof) of the kind shown in FIG. 1 are arranged such that their select transistors and antifuses are serially connected, as shown in FIG. 2 (i.e., one of source/drain regions is connected in series to one end of the antifuse). The memory cells are arranged in the form of a matrix array. The gate electrodes of the memory cells in the row direction are connected to word lines WR1, WR2, (the ones of) the source/drain diffusion layers of the memory cells in the column direction are connected to bit lines BL1, BL2, respectively, and the other ends of the antifuses of the memory cells are electrically connected to a common source line SOURCE.

The non-volatile semiconductor memory device according to the first exemplary embodiment can be manufactured by a standard CMOS process. For example, the memory cell shown in FIG. 1 can be manufactured by forming the element isolation region 2 in the semiconductor substrate 1; then forming a thermal oxide film by thermally oxidizing the surface of the semiconductor substrate 1; etching away the thermal oxide film in a region that forms the thick gate insulating film 4 thereafter; forming a thick thermal oxide film and a thin thermal oxide film by thermally oxidizing the surface of the semiconductor substrate 1; then forming a polysilicon film; followed by etching to form the gate electrode 6, thick gate insulating film 4, fuse upper electrode 7 and thin gate insulating film 5; thereafter forming the source/drain layers (regions) 3 and the fuse lower-electrode diffusion layer 27 by introducing impurity; then forming the interlayer insulating film 11; followed by forming holes for forming the bit contact 10 and connection contact 28; and finally burying the bit contact 10 and connection contact 28 in the respective holes.

Next, the operation of the non-volatile semiconductor memory device according to the first exemplary embodiment of the present invention will be described with reference to the drawings, in which FIG. 2 is a circuit diagram schematically illustrating the configuration of a non-volatile semiconductor memory device according to the first exemplary embodiment and FIG. 3 is a table illustrating potentials at write and read of each wire of the non-volatile semiconductor memory device according to the first exemplary embodiment.

In the case of a write operation, the semiconductor substrate 1 and the common source line SOURCE connected to the fuse lower-electrode diffusion layer 27 in FIG. 1 are brought to ground potential, and a write potential VPP (a positive high potential) is applied to the select bit line BL1 and select word line WR1. As a result, a breakdown potential is applied only to the fuse upper electrode 7 of the antifuse 9 of a select memory cell 13 in FIG. 2 and the thin gate insulating film 5 of the antifuse 9 is broken down. In other words, a potential capable of breaking down the antifuse is applied to the one end of the antifuse from the side of the select transistor.

In the case of a read operation, the semiconductor substrate 1 and the common source line SOURCE connected to the fuse lower-electrode diffusion layer 27 in FIG. 1 are brought to ground potential, and an IO potential VddIO is applied to the select bit line WR1 and select word line BL1. As a result, if the thin gate insulating film 5 of the antifuse 9 in FIG. 1 has been broken down, the antifuse conducts, whereas if the thin gate insulating film 5 has not been broken down, the antifuse does not conduct and data that has been written to the memory cell can be read out.

It should be noted that control of the potential of each wire is carried out by a controller which is not shown. Further, in the write operation, the semiconductor substrate 1 and fuse lower-electrode diffusion layer 27 in FIG. 1 are placed at ground potential and the drain 3 of select transistor 8 and the gate electrode 6 in FIG. 1 are placed at a positive high potential. However, the semiconductor substrate 1 and fuse lower-electrode diffusion layer 27 may just as well be placed at a positive high potential and the drain 3 of select transistor 8 and the gate electrode 6 may just as well be placed at ground potential.

In accordance with the first exemplary embodiment, a suppression potential is not required for controlling operation of the memory cell, the operating potentials are few in number and operation is simple. As a result, the scale of peripheral circuitry can be reduced as well as the macro size, chip size and cost. A further effect is that it is possible to obtain a highly reliable non-volatile semiconductor memory device in which, when the thin gate insulating film 5 of the antifuse 9 is subjected to insulation breakdown to perform the write operation, the insulation breakdown occurs in reliable fashion without change in resistance after breakdown. In other words, the write potential conveyed to the antifuse 9 via the select transistor 8 is applied to the fuse upper electrode 7. As a consequence, it is possible for breakdown of the thin gate insulating film 5 of antifuse 9 to be brought about by FN tunnel current, and it is possible to suppress gate breakdown due to hot carriers produced by avalanche breakdown or band-to-band tunnel from the side of the fuse lower-electrode diffusion layer 27 near the edge of the polysilicon. Furthermore, formation is possible with reduced manufacturing cost without adding steps to the standard CMOS process.

[Second Exemplary Embodiment]

Figure 4:
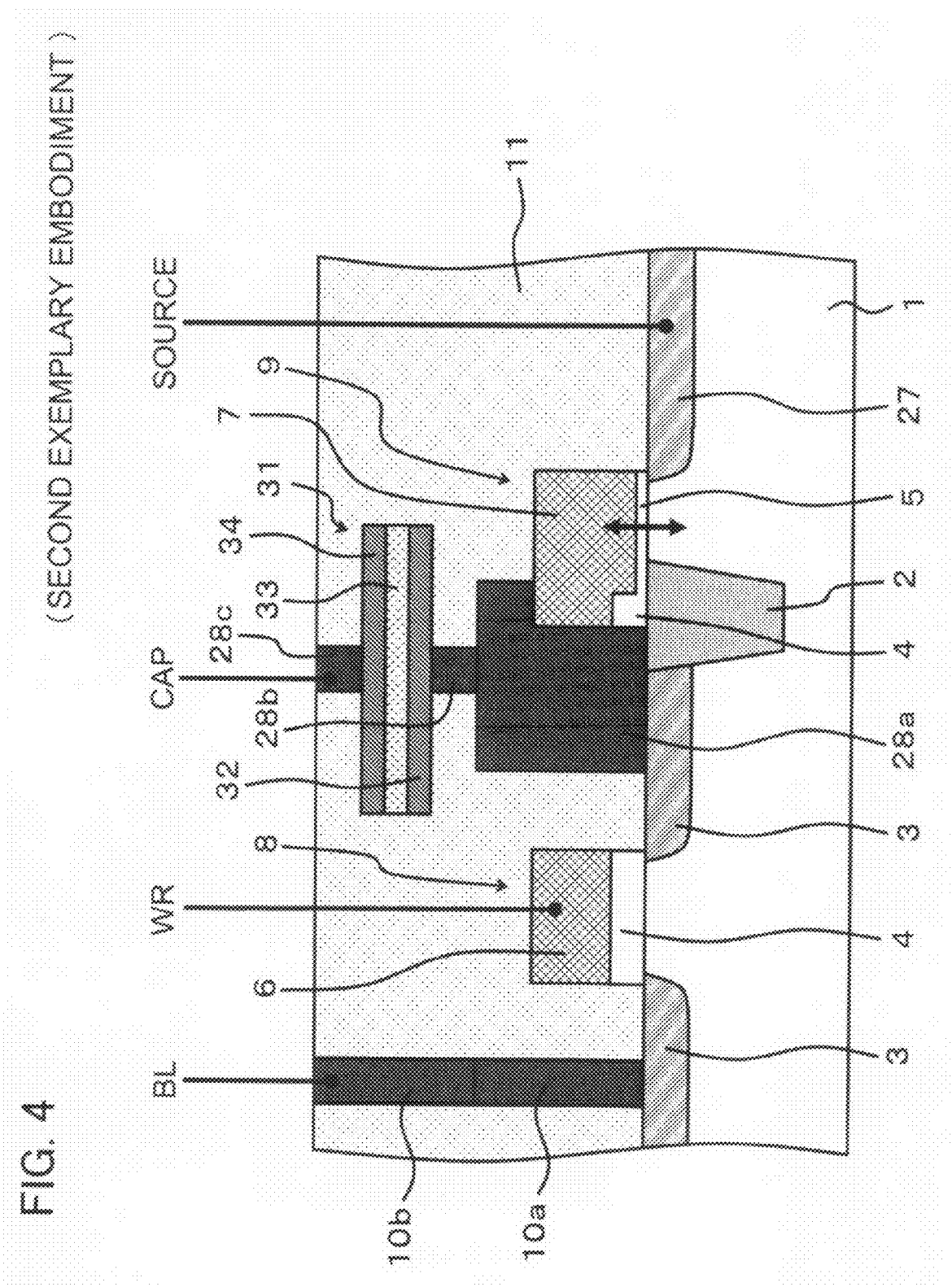
FIG. 4 is a partial sectional view schematically illustrating a configuration of a memory cell in a non-volatile semiconductor memory device according to a second exemplary embodiment of the present invention.

A non-volatile semiconductor memory device according to according to a second exemplary embodiment of the invention will now be described with reference to the drawings, in which FIG. 4 is a partial sectional view schematically illustrating the configuration of a memory cell in a non-volatile semiconductor memory device according to the second exemplary embodiment.

Figure 5:
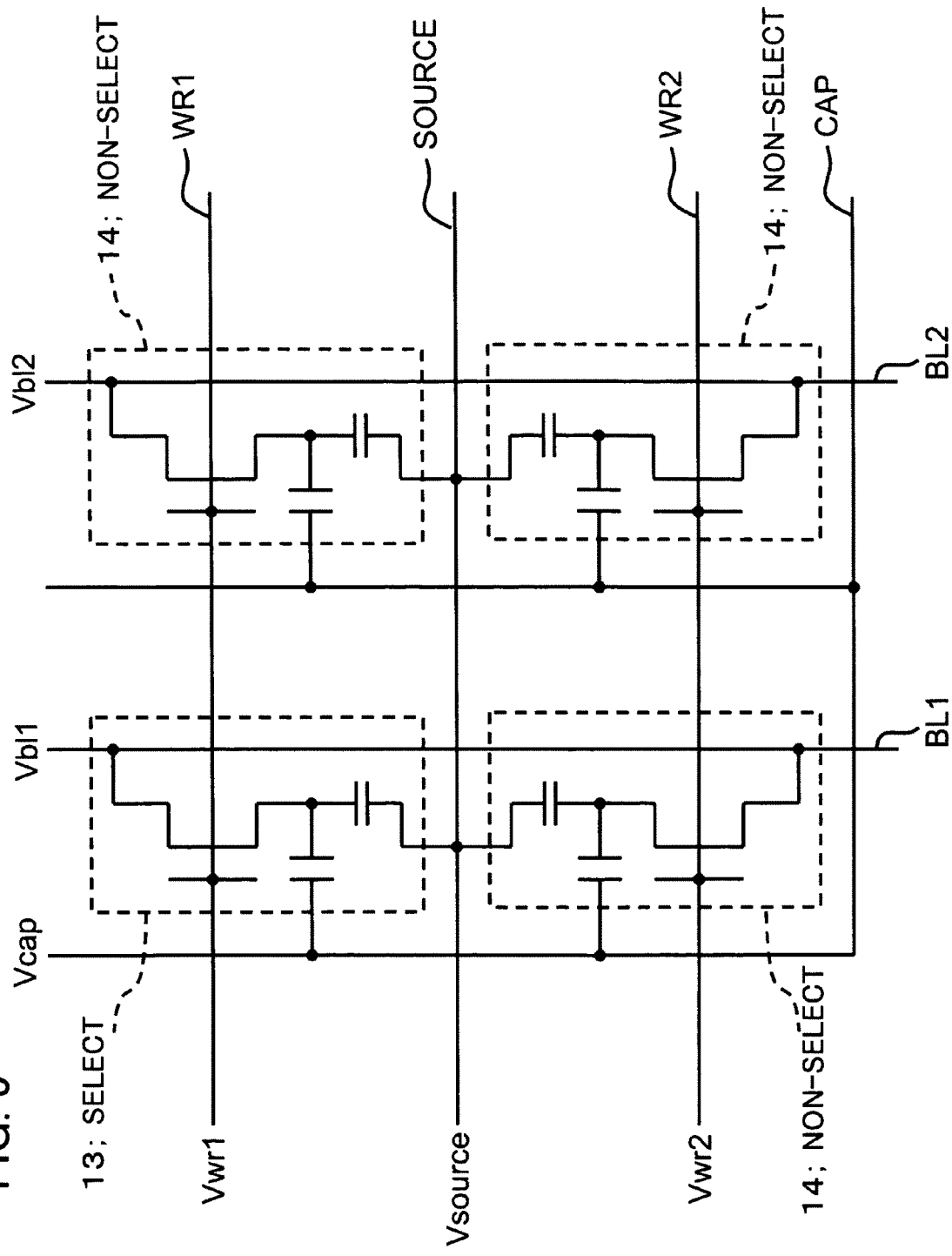
FIG. 5 is a circuit diagram schematically illustrating a configuration of a non-volatile semiconductor memory device according to the second exemplary embodiment.

The non-volatile semiconductor memory device according to according to the second exemplary embodiment includes a capacitor 31 having a capacitor lower electrode 32, a capacitor insulating film 33 and a capacitor upper electrode 34 stacked from bottom to top in the order mentioned. The capacitor 31 is formed in the interlayer insulating film 11 over a connection contact 28a connected to one of the source/drain layers 3 and fuse upper electrode 7. The capacitor lower electrode 32 is electrically connected to the connection contact 28a via a connection contact 28b. The capacitor upper electrode 34 is electrically connected to a capacitor plate line CAP via a connection contact 28c. Other basic components (the select transistor 8 and antifuse 9) are similar to those of the first exemplary embodiment. The memory cells of the kind shown in FIG. 4 are arrayed such that their select transistors and antifuses are serially connected, as shown in FIG. 5. The memory cells are arranged in the form of a matrix array. The gate electrodes of the memory cells in the row direction are connected to word lines WR1, WR2, the source/drain diffusion layers of the memory cells in the column direction are connected to bit lines BL1, BL2, and one ends of the antifuses of the memory cells are electrically connected to the common source line SOURCE. The upper electrodes of the capacitors of the memory cells are connected to the common capacitor plate line CAP.

Next, the operation of the non-volatile semiconductor memory device according to the second exemplary embodiment of the present invention will be described with reference to the drawings, in which FIG. 5 is a circuit diagram schematically illustrating the configuration of a non-volatile semiconductor memory device according to the second exemplary embodiment and FIG. 6 is a table illustrating potentials at write and read of each wire of the non-volatile semiconductor memory device according to the second exemplary embodiment.

In the case of a write operation, the semiconductor substrate 1 and the common source line SOURCE connected to the fuse lower-electrode diffusion layer 27 in FIG. 4 are brought to ground potential, VPP/2 is applied to the select bit line BL1, VPP is applied to and select word line WR1, the potentials of the select word line WR1 and select bit line BL1 are lowered after the node of the fuse upper electrode 7 in FIG. 4 is charged, the write potential of VPP/2 is applied to the common capacitor plate line CAP connected to the capacitor upper electrode 34 in FIG. 4, the potential of the fuse upper electrode 7 connected to the capacitor lower electrode 32 in FIG. 4 is boosted to the extent of VPP and the thin gate insulating film 5 of the fuse upper electrode 7 in FIG. 4 is broken down.

The read operation is similar to that of the first exemplary embodiment and need not be described again.

In accordance with the second exemplary embodiment, breakdown of the thin gate insulating film 5 of antifuse 9 is performed at a boosted potential ascribable to the capacitor 31. This is advantageous in that overcurrent does not flow and power consumption at the time of the write operation can be reduced. Further, since the capacitor 31 is formed on the upper portion of the antifuse 9, formation can be achieved without increasing the area of the memory cell.

[Third Exemplary Embodiment]

Figure 7:
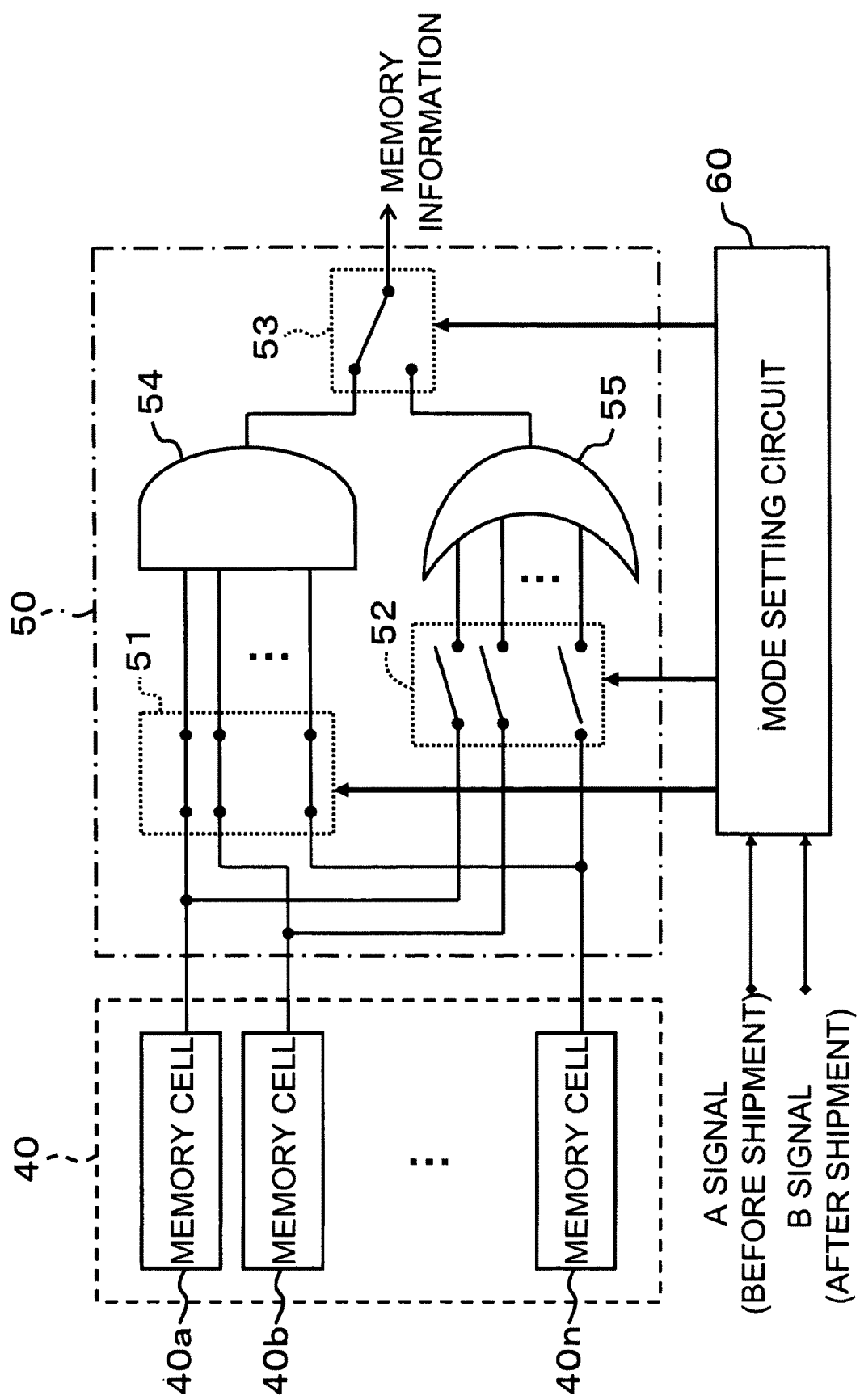
FIG. 7 is a diagram schematically illustrating a circuit configuration of a non-volatile semiconductor memory device according to a third exemplary embodiment of the present invention.
Figure 8:
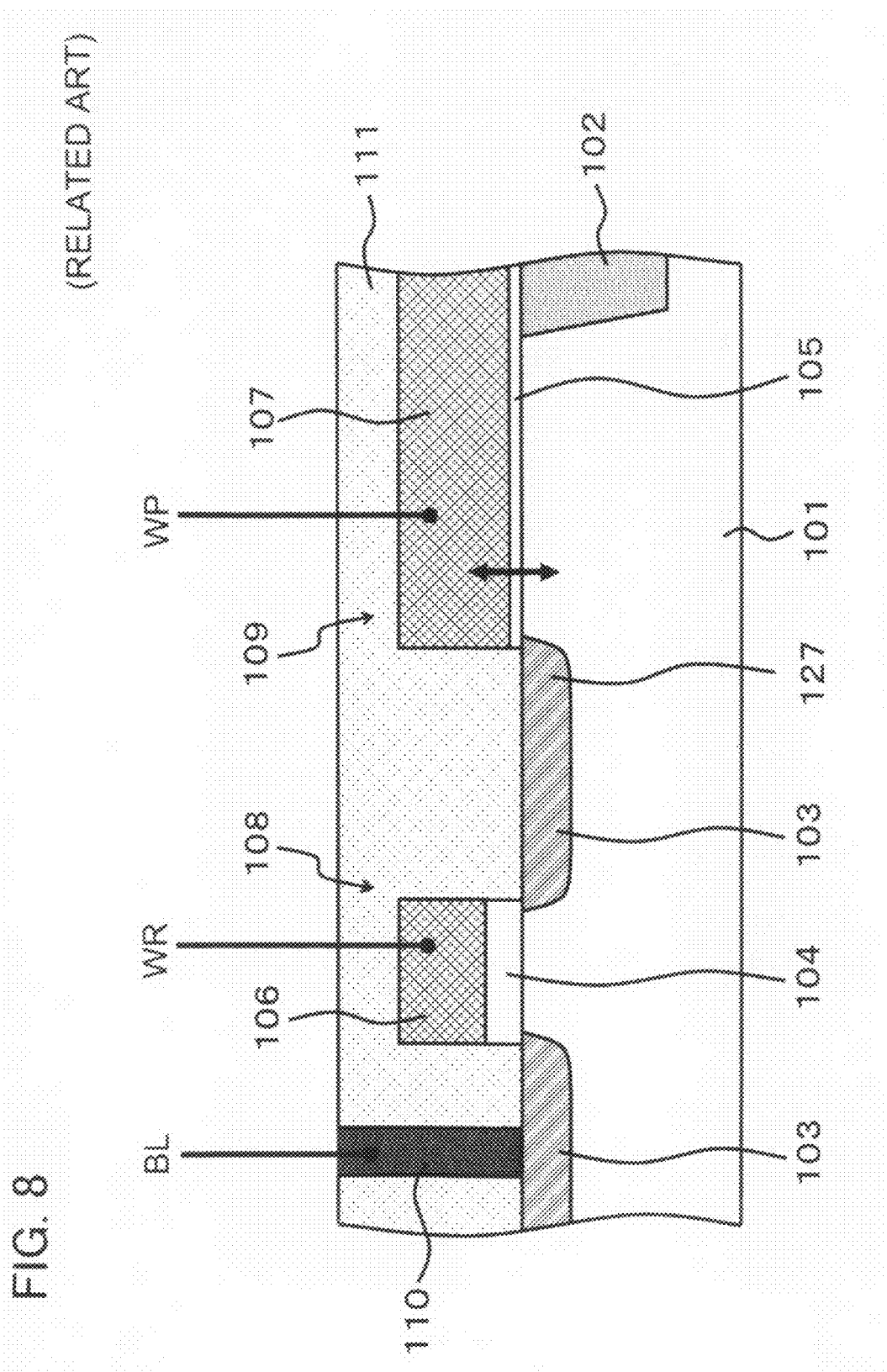
FIG. 8 is a partial sectional view schematically illustrating a configuration of a memory cell in a non-volatile semiconductor memory device according to a conventional art for comparative analysis.
Figure 9:
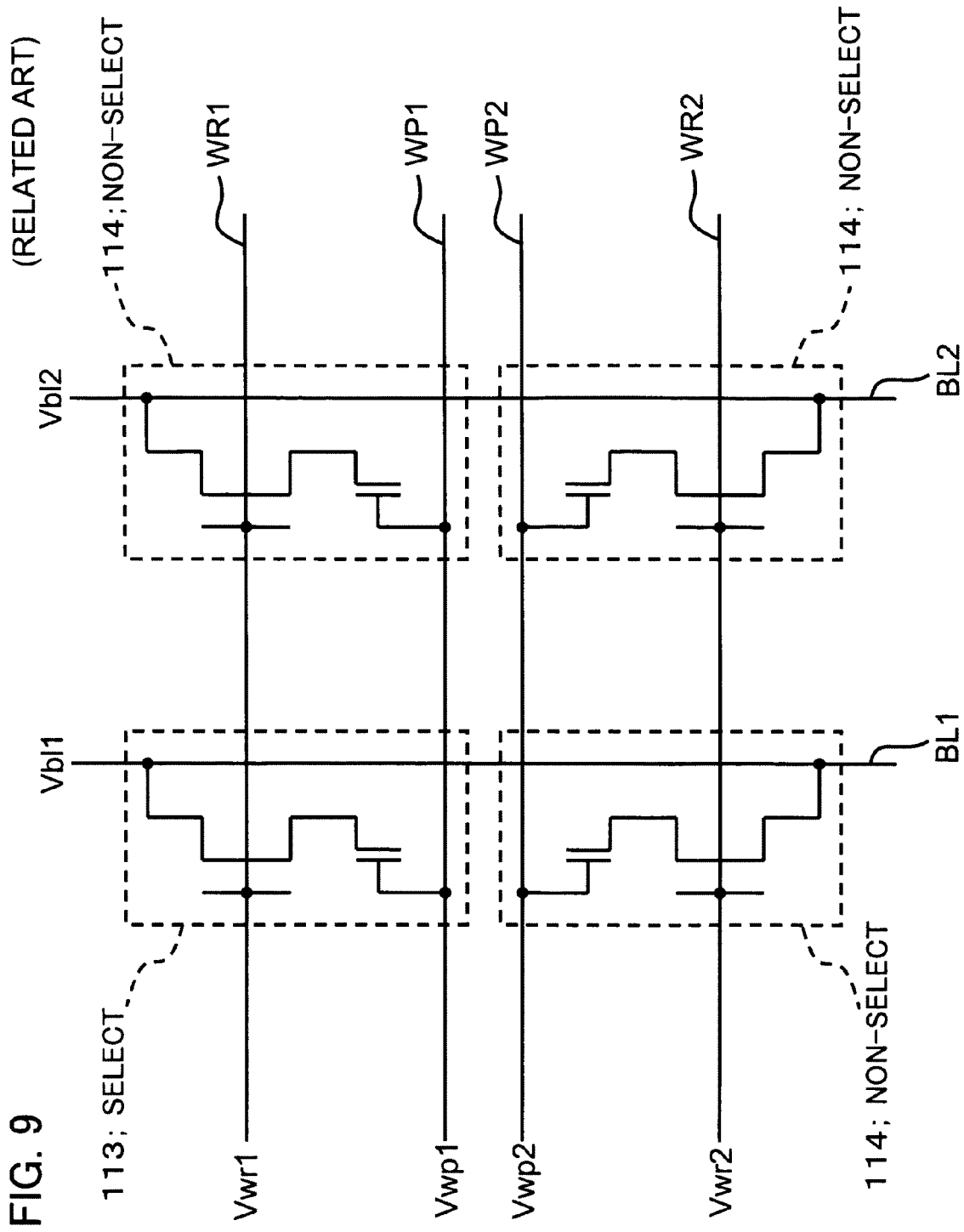
FIG. 9 is a circuit diagram schematically illustrating a configuration of a non-volatile semiconductor memory device according to a conventional art for comparative analysis.

A non-volatile semiconductor memory device according to a third exemplary embodiment of the present invention will now be described with reference to the drawings, in which FIG. 7 is a diagram schematically illustrating the circuit configuration of a non-volatile semiconductor memory device according to a third exemplary embodiment of the present invention.

The non-volatile semiconductor memory device according to a third exemplary embodiment has a memory cell unit 40, a control circuit 50 and a mode setting circuit 60.

The memory cell unit 40 has memory cells 40a, 40b, ..., 40n in each of which the select transistor 8 and antifuse 9 of FIG. 1 are serially connected. The memory cell unit 40 stores one item of information by the plurality of memory cells 40a, 40b, ..., 40n. The bit lines BL (FIG. 1) of the memory cells 40a, 40b, ..., 40n are electrically connected to each of first and second selecting circuits 51, 52, respectively, of the control circuit 50.

The control circuit 50 controls the output of memory information in accordance with signals from each of the memory cells 40a, 40b, ..., 40n of memory cell unit 40. The control circuit 50 controls the output of the memory information based upon control signals from the mode setting circuit 60. The control circuit 50 includes the first and second selecting circuits 51, 52, a third selecting circuit 53, an AND gate 54 and an OR gate 55.

On the basis of a control signal from the mode setting circuit 60, the first selecting circuit 51 controls the switching of each of the wires between the memory cells 40a, 40b, ..., 40n and the AND gate 54. The first selecting circuit 51 places each wire in the ON state when an A signal is input to the mode setting circuit 60 and places each wire in the OFF state when a B signal is input to the mode setting circuit 60.

On the basis of a control signal from the mode setting circuit 60, the second selecting circuit 52 controls the switching of each of the wires between the memory cells 40a, 40b, ..., 40n and the OR gate 55. The second selecting circuit 52 places each wire in the OFF state when the A signal is input to the mode setting circuit 60 and places each wire in the ON state when the B signal is input to the mode setting circuit 60.

On the basis of a control signal from the mode setting circuit 60, the third selecting circuit 53 exercises control so as to select and output information from either the AND gate 54 or the OR gate 55. The third selecting circuit 53 outputs information from the AND gate 54 when the A signal is input to the mode setting circuit 60 and outputs information from the OR gate 55 when the B signal is input to the mode setting circuit 60.

The AND gate 54 outputs logical "1" as the memory information to the third selecting circuit 53 when the signals that have been input from the memory cells 40a, 40b, ..., 40n of the memory cell unit 40 via the first selecting circuit 51 are all logical "1" (the antifuse 9 in FIG. 1 conducts) and outputs logical "0" to the third selecting circuit 53 otherwise.

The OR gate 55 outputs logical "1" as the memory information to the third selecting circuit 53 when any or all of the signals that have been input from the memory cells 40a, 40b, ..., 40n of the memory cell unit 40 via the second selecting circuit 52 are logical "1" (the antifuse 9 in FIG. 1 conducts) and outputs logical "0" to the third selecting circuit 53 otherwise.

The mode setting circuit 60 controls the operating mode of the control circuit 50. When the A signal is being input, the mode setting circuit 60 exercises control so as to output signals so as to place the first selecting circuit 51 in the ON state, place the second selecting circuit 52 in the OFF state and cause the third selecting circuit 53 to select the AND gate 54. When the B signal is being input, the mode setting circuit 60 exercises control so as to output signals so as to place the first selecting circuit 51 in the OFF state, place the second selecting circuit 52 in the ON state and cause the third selecting circuit 53 to select the OR gate 55.

An example of operation of the non-volatile semiconductor memory device will be described.

When the A signal is input to the mode setting circuit 60 prior to shipment, the signals from the memory cells 40a, 40b, . . . , 40n of the memory cell unit 40 are input to the AND gate 54 via the first selecting circuit 51 and, if all of the signals are logical "1", the AND gate 54 outputs logical "1" as the memory information via the third selecting circuit 53.

When the B signal is input to the mode setting circuit 60 on or after shipment, the signals from the memory cells 40a, 40b, . . . , 40n of the memory cell unit 40 are input to the OR gate 55 via the second selecting circuit 52 and, if any or all of the signals are logical "1", the OR gate 55 outputs logical "1" as the memory information via the third selecting circuit 53.

In accordance with the third exemplary embodiment, criteria for judging the acceptability of the antifuse 9, for example, are made more relaxed after shipment than before shipment. This makes it possible to lower the probability of occurrence of failure ascribable to the antifuse 9 after shipment. Such failure can be caused by a change with time or a stress-induced change such as a fluctuation in the resistance of the antifuse 9 after data is written to the memory cells 40a, 40b, . . . , 40n.

[Fourth Exemplary Embodiment]

Figure 11:
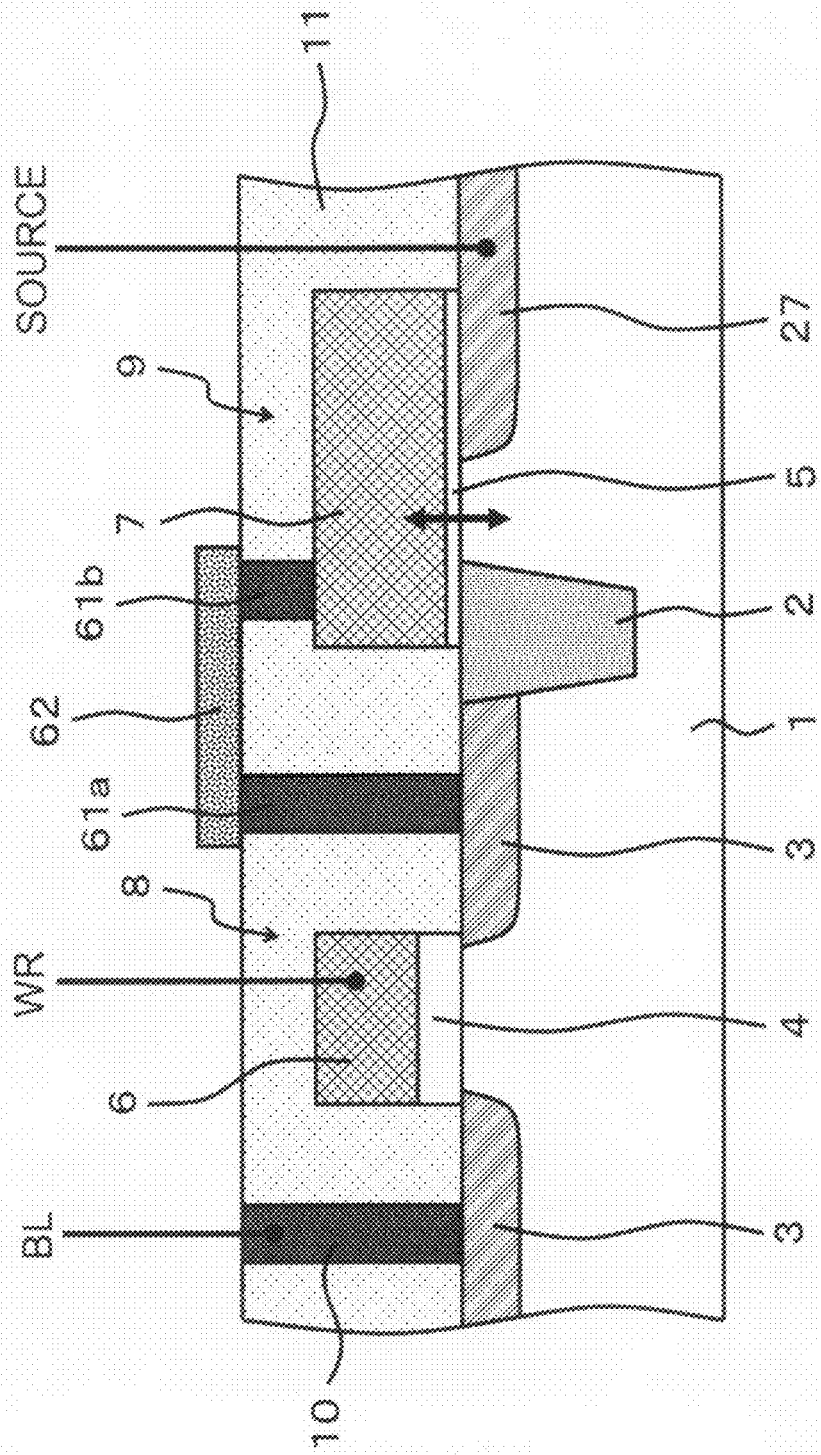
FIG. 11 is a sectional view taken along X-X' of FIG. 12 schematically illustrating a configuration of a memory cell in a non-volatile semiconductor memory device according to a fourth exemplary embodiment of the present invention.
Figure 12:
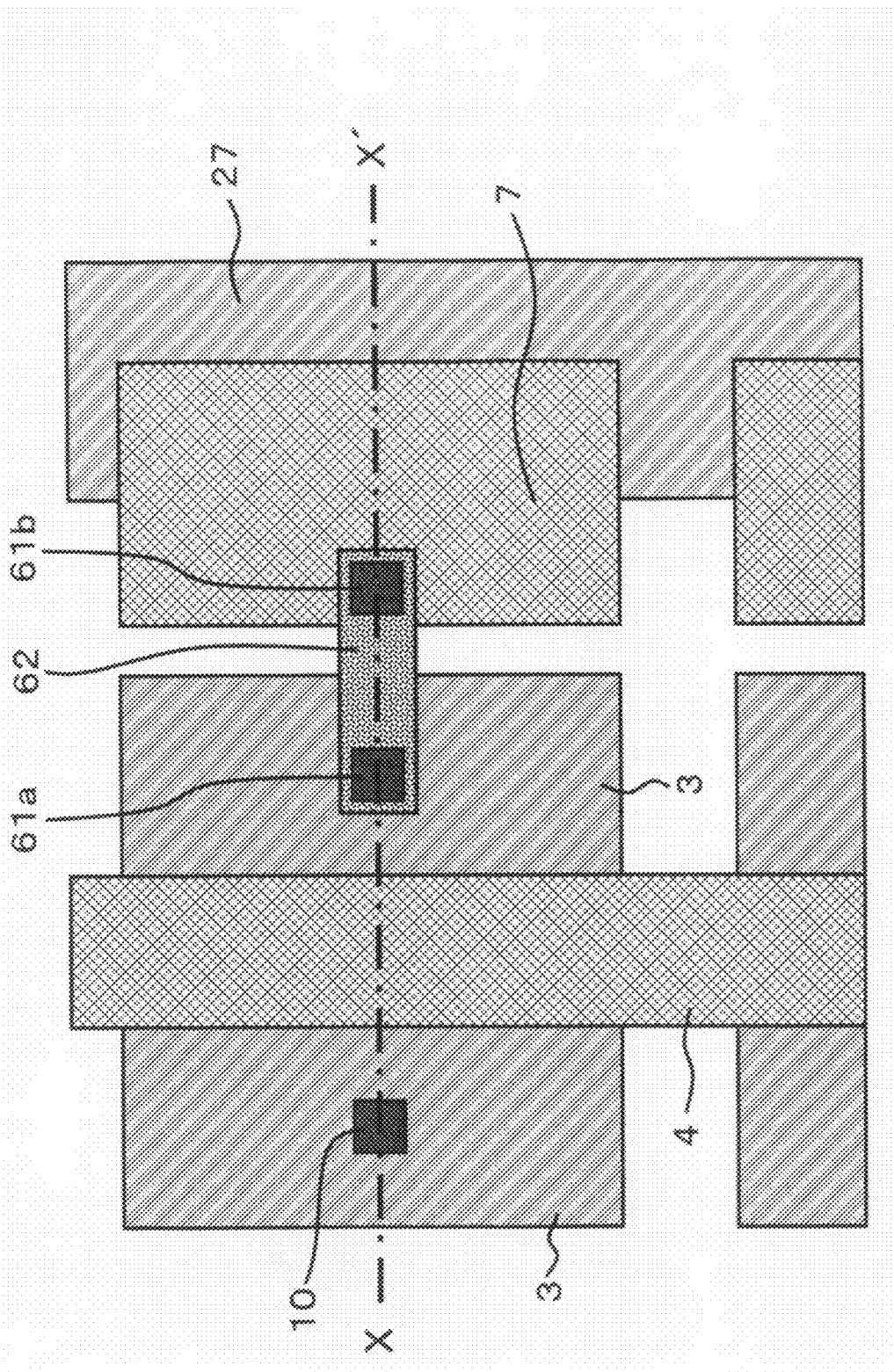
FIG. 12 is a partial plan view schematically illustrating a configuration of a memory cell in the non-volatile semiconductor memory device according to the fourth exemplary embodiment.

A non-volatile semiconductor memory device according to a fourth exemplary embodiment of the present invention will now be described with reference to the drawings, in which FIG. 11 is a sectional view taken along line X-X' of FIG. 12 schematically illustrating the configuration of a memory cell in the non-volatile semiconductor memory device according to the fourth exemplary embodiment, and FIG. 12 is a partial plan view schematically illustrating a configuration of a memory cell in the non-volatile semiconductor memory device according to the fourth exemplary embodiment.

In the non-volatile semiconductor memory device according to the first exemplary embodiment shown in FIG. 1, the connection contact 28 is formed in a single opening that is formed in the interlayer insulating film 11, which has been formed over the select transistor 8 and antifuse 9, and that includes part of the source/drain layer (one of the source/drain regions) 3 and part of the fuse upper electrode 7 as portions of the opening wall. On the other hand, in the non-volatile semiconductor memory device according to the fourth exemplary embodiment, a connection contact comprises a connection contact 61a formed in a first opening that is formed in the interlayer insulating film 11, which has been formed over the select transistor 8 and antifuse 9, and that includes part of the source/drain layer 3; a connection contact 61b that is formed in a second opening that is formed in the interlayer insulating film 11 and includes part of the fuse upper electrode 7 as portions of the opening wall, respectively; and metal wiring 62 electrically connecting the connection contact 61a and connection contact 61b. The antifuse 9, which has the structure of a MOS transistor, has the fuse upper electrode 7 of polysilicon formed via the thin gate insulating film 5 on part of the semiconductor substrate 1 and fuse lower-electrode diffusion layer 27 in the area bridging between the fuse lower-electrode diffusion layer 27 and element isolation region 2. Other structural components and operation are similar to those of the first exemplary embodiment.

Figure 25:
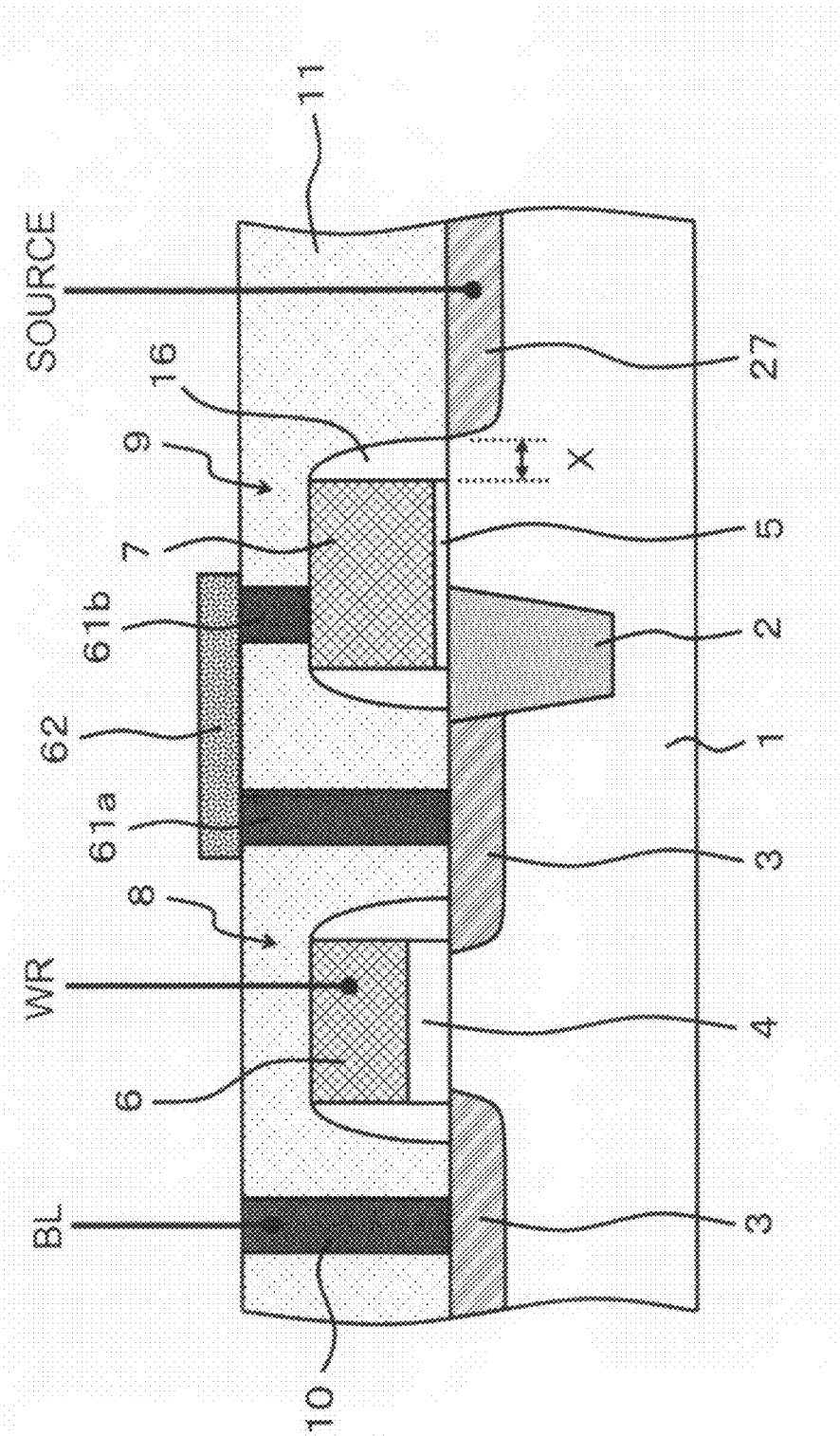
FIG. 25 is a partial sectional view schematically illustrating a modified variance of the configuration of a memory cell in a non-volatile semiconductor memory device according to the fourth exemplary embodiment.

Meanwhile, it is preferable to arrange the antifuse 9 so as to set the upper electrode 7 apart (offset) from the lower electrode 27 (refer to FIG. 25). Detail is similar to the first exemplary embodiment.

In accordance with the fourth exemplary embodiment, the source/drain layer 3 and the fuse upper electrode 7 are electrically connected using the two connection contacts 61a, 61b and metal wiring 62, in which the two connection contacts have a simple "hole" shape. In comparison with the case of the first exemplary embodiment in which a single connection contact is used, no use is made of a contact having a profiled shape. This is advantageous in that manufacture is easier.

[Fifth Exemplary Embodiment]

Figure 13:
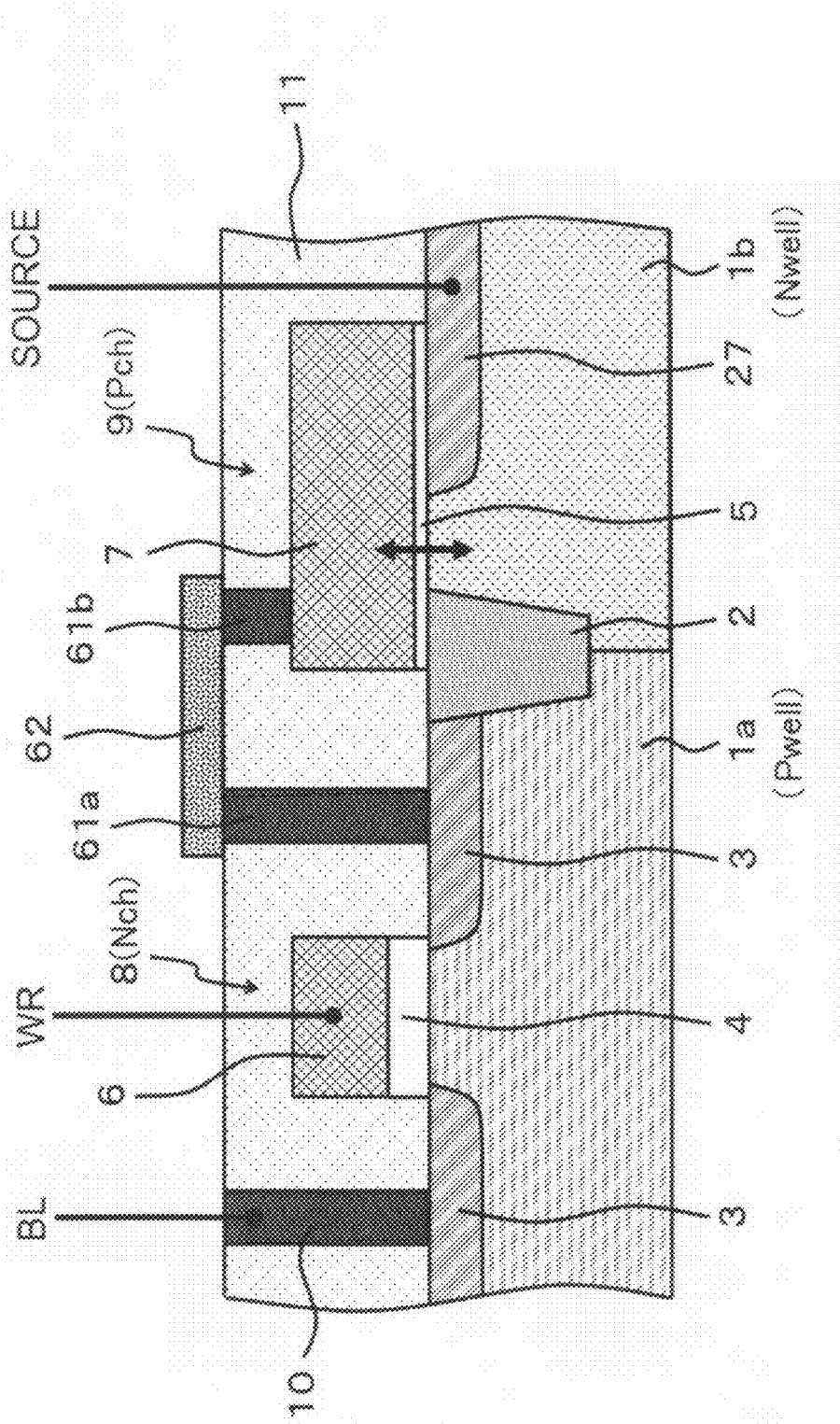
FIG. 13 is a partial sectional view schematically illustrating a configuration of a memory cell in a non-volatile semiconductor memory device according to a fifth exemplary embodiment of the present invention.

A non-volatile semiconductor memory device according to a fifth exemplary embodiment of the present invention will now be described with reference to the drawings, in which FIG. 13 is a partial sectional view schematically illustrating a configuration of a memory cell in a non-volatile semiconductor memory device according to the fifth exemplary embodiment.

In the non-volatile semiconductor memory device according to the fifth exemplary embodiment, select transistor 8 is of the N-channel-type and is constructed on a P-well 1a formed in the semiconductor substrate (not shown), and the antifuse 9 is of the P-channel-type and is constructed on an N-well 1b formed in the semiconductor substrate (not shown). Other structural components are similar to those of the fourth exemplary embodiment.

Meanwhile, it is preferable to arrange the antifuse 9 so as to set the upper electrode 7 apart (offset) from the lower electrode 27 (refer to FIG. 26). Detail is similar to the first exemplary embodiment.

Figure 14:
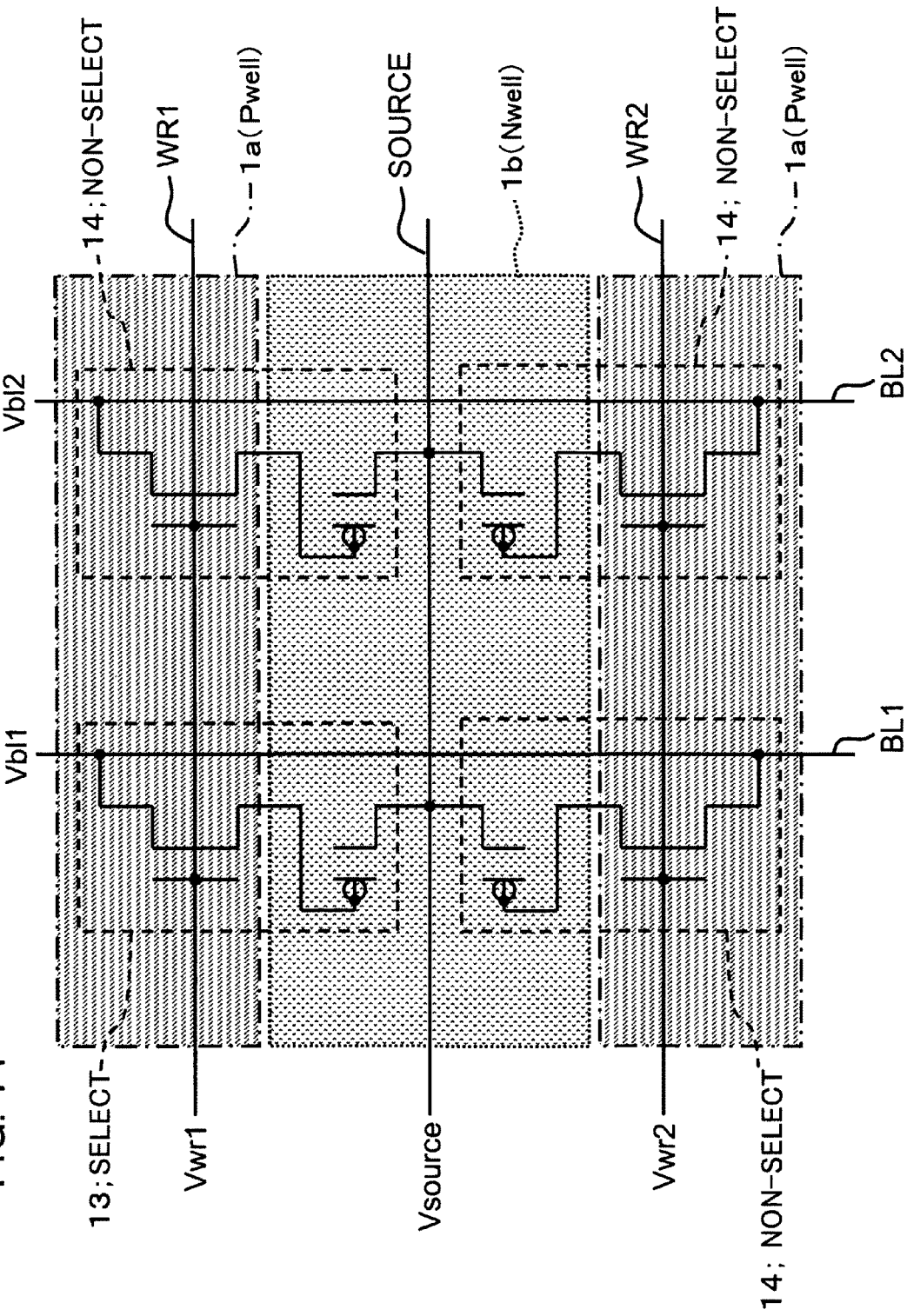
FIG. 14 is a circuit diagram schematically illustrating a configuration of a non-volatile semiconductor memory device according to the fifth exemplary embodiment.

Memory cells (a set thereof) of the kind shown in FIG. 13 are arranged such that their select transistor and antifuse are serially connected, as shown in FIG. 14 in each memory cell. The memory cells are arrayed in the form of a matrix. The gate electrodes of the memory cells in the row direction are connected to the word lines WR1, WR2, ones of the source/drain diffusion layers (regions) of the memory cells in the column direction are connected to the bit lines BL1, BL2, and the other ends of the antifuses of the memory cells are electrically connected to the common source line SOURCE. The N-wells 1b of the select transistors are arrayed in the row direction along the word lines WR1, WR2. The P-well(s) 1a of the antifuses is (are) arranged between the N-wells 1b. The N-well(s) 1b of the select transistors is (are) electrically connected in common in the entire cell array. The P-wells 1a of the antifuses are electrically connected in common in the entire cell array. The common source lines SOURCE also are electrically connected in common in the entire cell array.

Next, the operation of the non-volatile semiconductor memory device according to the fifth exemplary embodiment of the present invention will be described with reference to the drawings, in which FIG. 14 is a circuit diagram schematically illustrating a configuration of a non-volatile semiconductor memory device according to the fifth exemplary embodiment and FIG. 15 is a table illustrating potentials at write and read of each wiring of the non-volatile semiconductor memory device according to the fifth exemplary embodiment.

In the case of a write operation, the P-well 1a and the N-well 1b are placed at ground potential, the common source line SOURCE is placed at negative write potential −VPP and the select bit line BL1 and select word line WR1 are placed at positive write potential VPP, as a result of which the thin gate insulating film 5 of the antifuse 9 in FIG. 13 is broken down by a potential difference of the positive and negative write potentials +/−VPP across the fuse lower-electrode diffusion layer 27 and fuse upper electrode 7 in FIG. 13.

In the case of the read operation, the P-well 1a, the N-well 1b and common source line SOURCE are placed at ground potential and the 10 potential VddIO is applied to the select word line WR1 and select bit line BL1 to perform the read operation. If the thin gate insulating film 5 of the antifuse 9 in FIG. 13 has been broken down, the antifuse conducts. If the thin gate insulating film 5 has not been broken down, the antifuse does not conduct and data that has been written to the memory cell can be read out.

Control of potential of each of the wires is carried out by a controller (not shown).

In accordance with the fifth exemplary embodiment, the write operation is performed by applying (a potential difference of) the positive and negative write potentials +/−VPP to the antifuse. This is advantageous in that the write potential can be made a potential having a low absolute value.

[Sixth Exemplary Embodiment]

Figure 16:
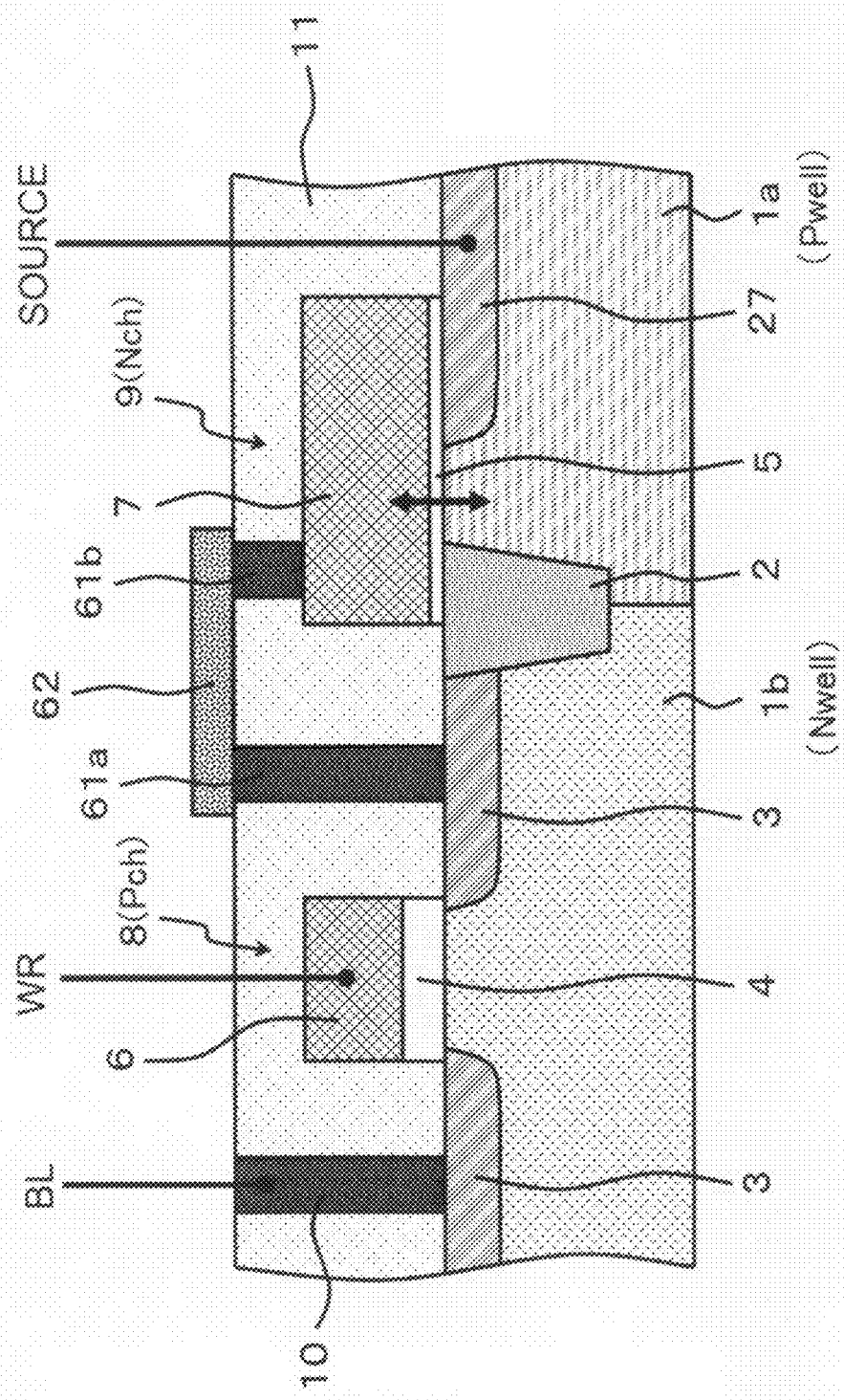
FIG. 16 is a partial sectional view schematically illustrating a configuration of a memory cell in a non-volatile semiconductor memory device according to a sixth exemplary embodiment of the present invention.

A non-volatile semiconductor memory device according to a sixth exemplary embodiment of the present invention will now be described with reference to the drawings, in which FIG. 16 is a partial sectional view schematically illustrating the configuration of a memory cell in a non-volatile semiconductor memory device according to a sixth exemplary embodiment of the present invention.

In the non-volatile semiconductor memory device according to the sixth exemplary embodiment, the select transistor 8 is of the P-channel-type and is constructed on an N-well 1b formed in the semiconductor substrate (not shown), and the antifuse 9 is of the N-channel-type and is constructed on a P-well 1a formed in the semiconductor substrate (not shown). Other structural components are similar to those of the fourth exemplary embodiment (FIG. 13).

Meanwhile, it is preferable to arrange the antifuse 9 so as to set the upper electrode 7 apart (offset) from the lower electrode 27 (refer to FIG. 27). Detail is similar to the first exemplary embodiment.

Figure 17:
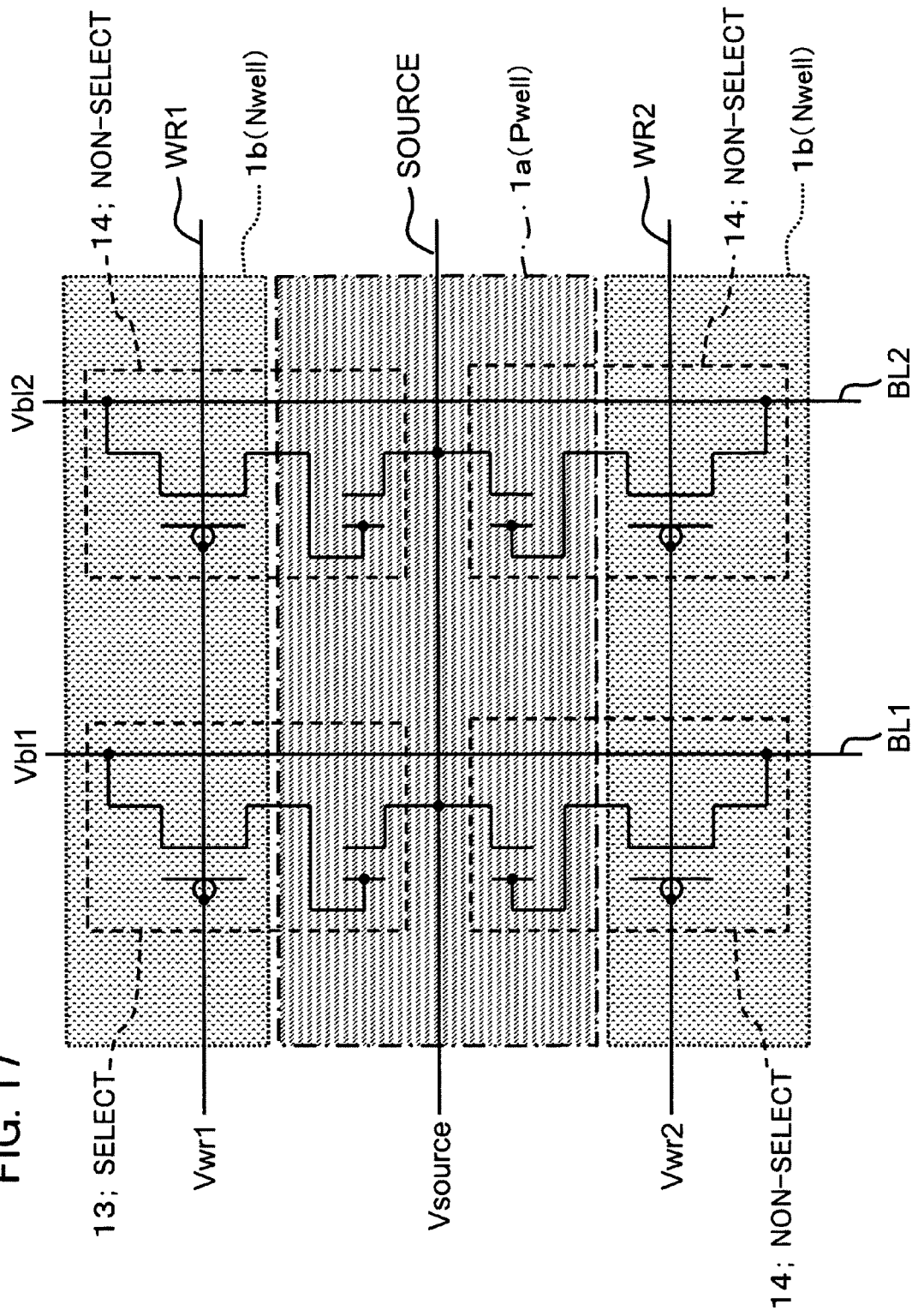
FIG. 17 is a circuit diagram schematically illustrating a configuration of a non-volatile semiconductor memory device according to the sixth exemplary embodiment.

Memory cells (a set thereof) of the kind shown in FIG. 16 are arranged such that their select transistors and antifuses are serially connected, as shown in FIG. 17. The memory cells are arrayed in the form of a matrix. The gate electrodes of the memory cells in the row direction are connected to the word lines WR1, WR2, ones of the source/drain diffusion layers (i.e., one ends) of the memory cells in the column direction are connected to the bit lines BL1, BL2, and the other ends of the antifuses of the memory cells are electrically connected to the common source line SOURCE. The N-wells 1b of the select transistors are arranged in the row direction along the word lines WR1, WR2. The P-wells 1a of the antifuses are arranged between the N-wells 1b. The N-wells 1b of the select transistors and the P-wells 1a of the antifuses are electrically connected in common in the entire cell array, respectively, and the common source lines SOURCE electrically connected to the fuse lower-electrode diffusion layer 27 in FIG. 16 also are electrically connected in common in the entire cell array.

Next, the operation of the non-volatile semiconductor memory device according to the sixth exemplary embodiment of the present invention will be described with reference to the drawings, in which FIG. 17 is a circuit diagram schematically illustrating the configuration of a non-volatile semiconductor memory device according to the sixth exemplary embodiment and FIG. 18 is a table illustrating potentials at write and read of each wire of the non-volatile semiconductor memory device according to the sixth exemplary embodiment.

In the case of a write operation, the P-well 1a and the common source line SOURCE are placed at ground potential and the select bit line BL1, select word line WR1 and N-well 1b of FIG. 16 are placed at the write potential VPP (a positive potential), as a result of which the thin gate insulating film 5 of the antifuse 9 in FIG. 16 is broken down.

In the case of the read operation, the P-well 1a and common source line SOURCE are placed at ground potential and the 10 potential. VddIO is applied to select word line WR1, select bit line BL1 and N-well 1b to perform the read operation, whereas if the thin gate insulating film 5 of the antifuse 9 in FIG. 16 has been broken down, the antifuse conducts. If the thin gate insulating film 5 has not been broken down, the antifuse does not conduct, and data that has been written to the memory cell can be read out.

Control of potential of each of the wires is carried out by a controller (not shown).

In accordance with the sixth exemplary embodiment, the select transistor 8 is made a P-channel-type transistor. As a result, a Vt drop (a decline threshold-value potential) of the write potential VPP can be suppressed and the write potential VPP applied to the drain (select bit line BL) can be applied to the fuse upper electrode 7 as is. An advantage is that the write potential VPP can be made a low voltage as a result. It should be noted that in a case where select transistor 8 of FIG. 16 is of the N-channel-type, as in the fifth exemplary embodiment, a potential which is reduced by an amount equivalent to the threshold value from the write potential VPP applied to the drain (select bit line BL) is applied to the fuse upper electrode 7 of FIG. 16.

[Seventh Exemplary Embodiment]

Figure 19:
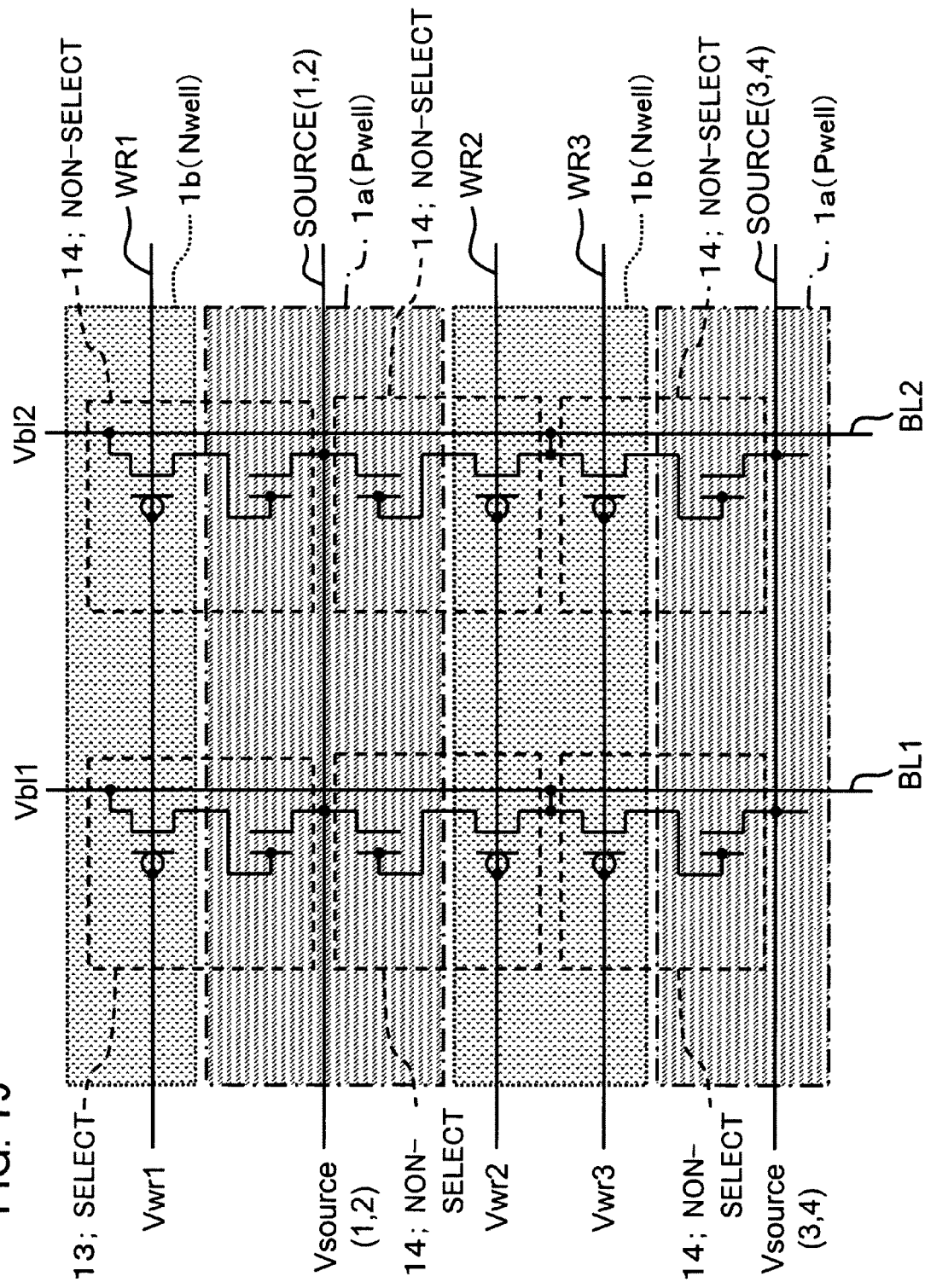
FIG. 19 is a circuit diagram schematically illustrating a configuration of a non-volatile semiconductor memory device according to a seventh exemplary embodiment of the present invention.

A non-volatile semiconductor memory device according to a sixth exemplary embodiment of the present invention will now be described with reference to the drawings, in which FIG. 19 is a circuit diagram schematically illustrating the configuration of a non-volatile semiconductor memory device according to a seventh exemplary embodiment of the present invention, and FIG. 20 is a table illustrating potentials at write and read of each wire of the non-volatile semiconductor memory device according to the seventh exemplary embodiment.

The non-volatile semiconductor memory device according to the seventh exemplary embodiment has a larger number of memory cells in the column direction in comparison with the sixth exemplary embodiment of FIG. 17.

The non-volatile semiconductor memory device according to the seventh exemplary embodiment is similar to that of the sixth exemplary embodiment of FIG. 16 in that the select transistor 8 is of the P-channel-type and is constructed on the N-well 1b formed in the semiconductor substrate (not shown), and the antifuse 9 is of the N-channel-type and is constructed on the P-well 1a formed in the semiconductor substrate (not shown). Memory cells (a set thereof) each comprising select transistor and antifuse are arranged such that the select transistor and antifuse are serially connected, as shown in FIG. 19. The memory cells are arrayed in the form of a matrix. The gate electrodes of the memory cells in the row direction are connected to word lines WR1, WR2, WR3, respectively, and one ends of the source/drain diffusion layers (source/drain regions) of the memory cells in the column direction are connected to the bit lines BL1, BL2, respectively. The fuse lower-electrode diffusion layers 27 (FIG. 16) of the first and second memory cells are electrically connected to a source line SOURCE (1,2). The fuse lower-electrode diffusion layers 27 (FIG. 16) of the third and fourth memory cells are electrically connected to another source line SOURCE (3,4). The fuse lower-electrode diffusion layers 27 (FIG. 16) of nth and (n+1)th memory cells (not shown) are electrically connected to a source line SOURCE (n,n+1). The N-wells 1b of the select transistors are arranged extending in the row direction along the word lines WR1, WR2, respectively. The P-wells 1a of the antifuses are arranged between the N-wells 1b. The N-wells 1b of the select transistors are electrically connected in common in the entire cell array, and the P-wells 1a of the antifuses are electrically connected in common in the entire cell array.

In the case of a write operation, the P-well 1a and source line SOURCE (1,2) are placed at ground potential, the source line SOURCE (3,4) is at an open state and the select bit line BL1, non-select word lines WR2, WR3 and N-well 1b are placed at a write potential VPP (a positive potential), as a result of which the thin gate insulating film 5 of the antifuse 9 in FIG. 16 is broken down. Note, non-select bit line BL2 and select word line WR1 are placed at ground potential.

In the case of the read operation, the P-well 1a and source lines SOURCE (1,2), SOURCE (3,4) are placed at ground potential and the IO potential VddIO is applied to select bit line BL1, non-select word lines WR2, WR3 and N-well 1b to perform the read operation. If the thin gate insulating film 5 of the antifuse 9 in FIG. 16 has been broken down, the antifuse conducts, whereas if the thin gate insulating film 5 has not been broken down, the antifuse does not conduct, and data that has been written to the memory cell can be read out.

Control of potential of each of the wires is carried out by a controller (not shown).

In accordance with the seventh exemplary embodiment, source lines are separated every two word lines. At the time of the write operation, only a source line connected to a select cell is grounded and the other source lines are placed to open, the advantage being that write disturbance that acts upon the antifuses of non-select cells whose sources are open is mitigated greatly. It should be noted that in the seventh exemplary embodiment, the N-wells of select transistors are cell-array common and VPP is applied to the N-wells of all non-select cells at the time of the write operation. As a result, the node potentials of the upper electrodes of the antifuses of non-select cells float and the potentials between these and lower electrodes of the grounded common sources may sustain write disturbance impressed upon the insulating films of the antifuses.

[Eighth Exemplary Embodiment]

Figure 21:
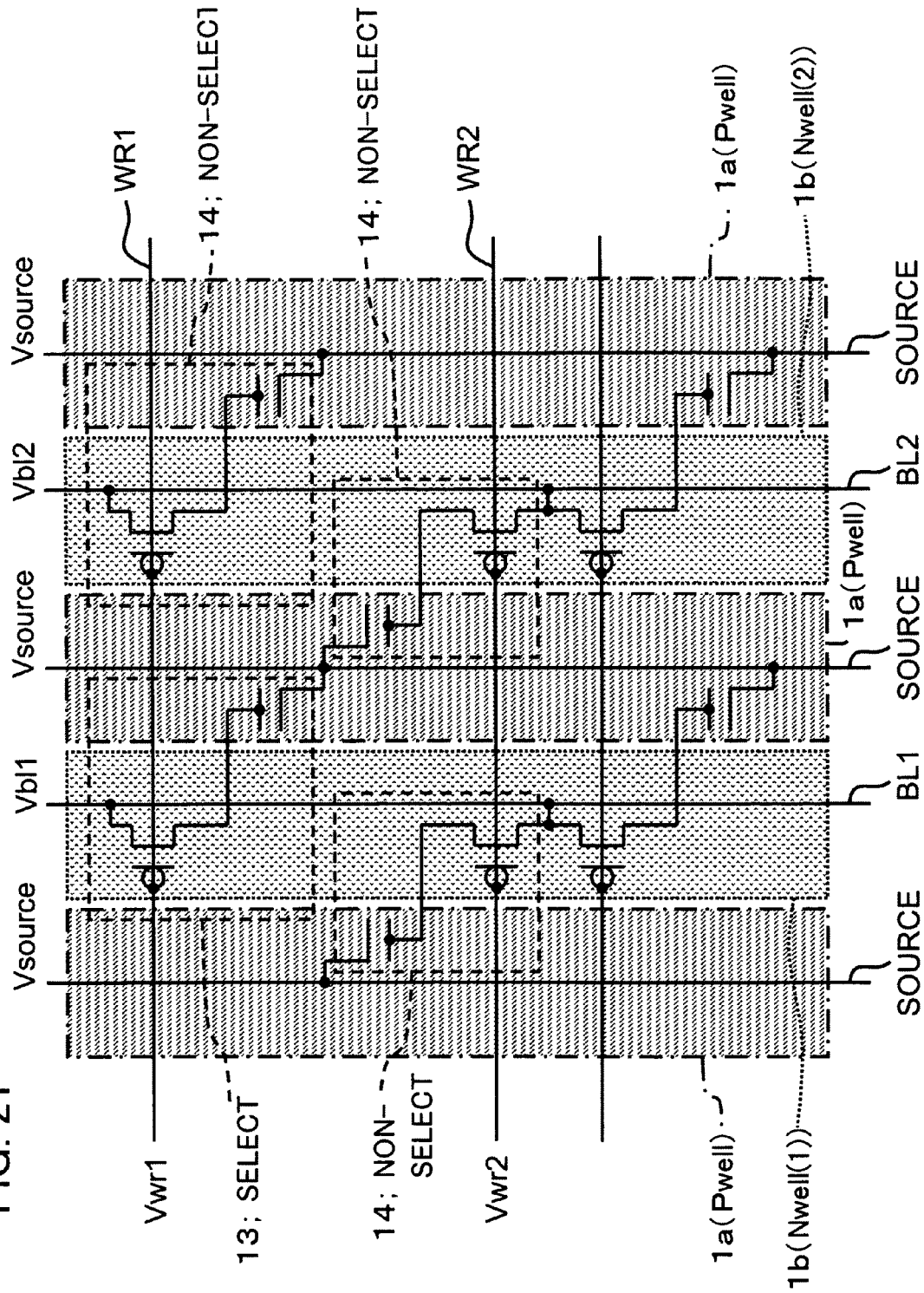
FIG. 21 is a circuit diagram schematically illustrating a configuration of a non-volatile semiconductor memory device according to an eighth exemplary embodiment of the present invention.

A non-volatile semiconductor memory device according to an eighth exemplary embodiment of the present invention will now be described with reference to the drawings, in which FIG. 21 is a circuit diagram schematically illustrating the configuration of a non-volatile semiconductor memory device according to an eighth exemplary embodiment of the present invention, and FIG. 22 is a table illustrating potentials at write and read of each wire of the non-volatile semiconductor memory device according to the eighth exemplary embodiment.

In the non-volatile semiconductor memory device according to the eighth exemplary embodiment, P-wells 1a and N-wells 1b extending in the row direction are not arranged alternatingly as in the sixth exemplary embodiment (see FIG. 16); rather, P-wells 1a and N-wells 1b extending in the column direction are arranged alternatingly with respect to the row direction.

The non-volatile semiconductor memory device according to the eighth exemplary embodiment is similar to that of the sixth exemplary embodiment of FIG. 16 in that the select transistor 8 is of the P-channel-type and is constructed on the N-well 1b formed in the semiconductor substrate (not shown), and the antifuse is of the N-channel-type and is constructed on the P-well 1a formed in the semiconductor substrate (not shown). Memory cells (a set thereof) comprising select transistors and antifuses are arranged such that the select transistor and antifuse are serially connected in each memory cell, as shown in FIG. 21. The memory cells are arrayed in the form of a matrix. The gate electrodes of the memory cells in the row direction are connected to word lines WR1, WR2, respectively, and one ends of one of the source/drain diffusion layers (source/drain regions) of the memory cells in the column direction are connected to the bit lines BL1, BL2, respectively. The fuse lower-electrode diffusion layers 27 (FIG. 16) of the memory cells (at the other ends thereof) are electrically connected to common source line SOURCE extending in the column direction. The N-wells 1b of the select transistors are arranged extending in the column direction along the bit lines B11, BL2. The P-wells 1a of the antifuses are arranged between the N-wells 1b. N-wells (1) 1b and N-wells (2) 1b of the select transistors have their potentials controlled separately. The P-wells 1a of the antifuses are electrically connected in common in the entire cell array, and the common source lines SOURCE electrically connected to the fuse lower-electrode diffusion layer (27 in FIG. 16) also are electrically connected in common in the entire cell array.

In the case of a write operation, the N-well (2) 1b, P-well 1a and common source line SOURCE are placed at ground potential, and the select bit line BL1, non-select word line WR2 and N-well (1) 1b are placed at a write potential VPP (a positive potential), as a result of which the thin gate insulating film 5 of the antifuse 9 in FIG. 16 is broken down.

In the case of the read operation, the N-well (2) 1b, P-well 1a and common source line SOURCE are placed at ground potential, and the 10 potential VddIO is applied to select bit line BL1, non-select word line WR2 and N-well (1) 1b to perform the read operation. If the thin gate insulating film 5 of the antifuse 9 in FIG. 16 has been broken down, the antifuse conducts, whereas if the thin gate insulating film 5 has not been broken down, the antifuse does not conduct, and data that has been written to the memory cell can be read out.

The eighth exemplary embodiment deals with the problem of write disturbance impressed upon the antifuse of a non-select cell at the time of the write operation as follows: The N-wells (1) and N-wells (2) are separated by the intervening bit line in the column arrangement. At the time of the write operation, the write potential VPP is applied only to N-wells of the selected column. As a result, the cells that sustain write disturbance are only the cells of the same column and disturbance time is mitigated by a wide margin.

In the present invention, there are various possible modes as follows.

In the first aspect, the non-volatile semiconductor memory device may further comprise: a memory cell unit having a plurality of memory cells each of which includes the select transistor and the antifuse; and a control circuit for controlling output of memory information in accordance with a signal from each memory cell of the memory cell unit. (mode 1)

The control circuit may have an OR gate to which signals from each of memory cells are input. (mode 2)

The control circuit may have an AND gate to which signals from each of memory cells are input. (mode 3)

The control circuit may have an AND gate to which signals from each of memory cells are input, and an OR gate to which the signal from each memory cell is input. (mode 4)

The device may further comprise a mode setting circuit for controlling operating mode of the control circuit. (mode 5)

The device may further comprise: a first selecting circuit for controlling switching of each wire between each of memory cells and the AND gate; a second selecting circuit for controlling switching of each wire between each of memory cells and the OR gate; and a third selecting circuit for exercising control so as to select and output information from one of the AND gate and OR gate; wherein the mode setting circuit controls the first, second and third selecting circuits. (mode 6)

When a first signal is being input, the mode selecting circuit may exercise control so as to output a control signal that places the first selecting circuit in an ON state, places the second selecting circuit in an OFF state and causes the third selecting circuit to select the AND gate; and when a second signal is being input, the mode selecting circuit may exercise control so as to output a control signal that places the first selecting circuit in an OFF state, places the second selecting circuit in an ON state and causes the third selecting circuit to select the OR gate. (mode 7)

In the non-volatile semiconductor memory device according to the second aspect, a plurality of sets each comprising the antifuse and the select transistor may be provided; and the other ends of each of the antifuses in each of the sets may be electrically connected in common. (mode 8)

In the non-volatile semiconductor memory device according to the third aspect, the select transistor and the antifuse may be each of an N-channel-type and may be constructed on P-well. (mode 9)

The select transistor may be of an N-channel-type and may be constructed on a P-well; and the antifuse may be of a P-channel-type and may be constructed on an N-well. (mode 10)

The select transistor may be of a P-channel-type and may be constructed on an N-well; and the antifuse may be of an N-channel-type and may be constructed on a P-well. (mode 11)

The N-well may be arranged extending in the row direction along the word lines. (mode 12)

The N-well may be arranged extending in the column direction along the bit lines. (mode 13)

The source line may be a common source line that is common with the entirety of the memory cell array. (mode 14)

The source line may be placed between the word lines and may be electrically connected to the lower electrodes of the antifuses disposed between the word lines. (mode 15)

Each of the antifuses may be a MOS half-transistor structure or a MOS transistor structure. (mode 16)

As many apparently widely different exemplary embodiments of the present invention can be made without departing from the spirit and scope thereof, it is to be understood that the invention is not limited to the specific exemplary embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A non-volatile semiconductor memory device comprising:
    a select transistor including source/drain regions on both sides of a channel of a semiconductor substrate and including a gate electrode on the channel via a first gate insulating film;
    an element isolation region formed on the semiconductor substrate in an area adjacent to said select transistor;
    an antifuse formed on the semiconductor substrate, the antifuse comprising:
        a lower electrode formed on the semiconductor substrate;
        an upper electrode formed on the semiconductor substrate in an area between said element isolation region and the lower electrode via a second gate insulating film; and
        side walls formed on sides of the upper electrode; and
        a connection contact electrically connecting one of the source/drain regions and the upper electrode and contacting said one of the source/drain regions and the upper electrode,
    wherein a side wall is formed on a well on the semiconductor substrate,
    wherein the upper electrode and the lower electrode are separated in a width of the side wall,
    wherein the sidewalls and a part of a top portion of the upper electrode is in direct contact with a single interlayer insulating film, and
    wherein the single interlayer insulating film is in direct contact with the upper electrode, at least one of the sidewalls of the upper electrode, the connection contact and the lower electrode.

2. The device according to claim 1, wherein said connection contact is formed in a single opening that is formed in the interlayer insulating film, which has been formed over said select transistor and said antifuse, and that includes part of the source/drain region and part of the upper electrode as a wall portion of the opening.

3. The device according to claim 1, wherein said connection contact comprises:
    a first connection contact formed in a first opening that is formed in an interlayer insulating film, which has been formed to cover said select transistor and said antifuse, and that includes an exposed part of the source/drain regions;
    a second connection contact formed in a second opening that is formed in the interlayer insulating film and that includes a part of the upper electrode as a part of an opening wall; and
    wiring for electrically connecting said first connection contact and said second connection contact.

4. The device according to claim 1, wherein the first gate insulating film and the second gate insulating film comprise gate insulating films having a same film thickness.

5. The device according to claim 1, wherein the second gate insulating film is thinner than the first gate insulating film.

6. The device according to claim 1, wherein the lower electrode comprises a diffusion layer in which impurity of the same conductivity type as that of diffusion layer of the source/drain regions has been introduced.

7. The device according to claim 1, wherein said lower electrode is of an impurity having a conductivity type different from that of the diffusion layer of the source/drain regions.

8. The device according to claim 7, wherein said lower electrode is horizontally not overlapping with said upper electrode as viewed in a direction perpendicular to the substrate.

9. The device according to claim 1, wherein lower electrodes of memory cells, each of which includes said select transistor and said antifuse, are electrically connected to a common source line.

10. The device according to claim 1, wherein said select transistor is of an N-channel-type.

11. The device according to claim 1, wherein said select transistor is of a P-channel-type.

12. The device according to claim 1, further comprising a controller for exercising control such that when a write operation is performed, the semiconductor substrate and the lower electrode are placed at a positive potential and the source/drain region and the gate electrode are placed at ground potential.

13. The device according to claim 1, further comprising a controller for exercising control such that when a read operation is performed, the semiconductor substrate and the lower electrode are placed at ground potential and the source/drain region and the gate electrode are placed at a positive potential.

14. The device according to claim 1, wherein said select transistor is of an N-channel-type and is constructed on a P-well that has been formed in the semiconductor substrate, and
wherein said antifuse is of a P-channel-type and is constructed on an N-well that has been formed in the semiconductor substrate.

15. The device according to claim 14, further comprising a controller for exercising control such that when a write operation is performed, the P-well of said select transistor and the N-well of said antifuse are placed at ground potential, the lower electrode of said antifuse is placed at a negative potential and the source/drain region and the gate electrode of said select transistor are placed at a positive potential.

16. The device according to claim 1, wherein said select transistor is of a P-channel-type and is constructed on an N-well that has been formed in said semiconductor substrate, and
wherein said antifuse is of an N-channel-type and is constructed on a P-well that has been formed in said semiconductor substrate.

17. The device according to claim 16, further comprising a controller for exercising control such that when a write operation is performed, the P-well of said antifuse and the lower electrode are placed at ground potential, the N-well and source/drain region of said select transistor are placed at a positive potential and the gate electrode is placed at ground potential.

18. The device according to claim 1, further comprising a capacitor at an upper portion of said antifuse, said capacitor comprises a capacitor lower electrode, a capacitor insulating film and a capacitor upper electrode stacked from bottom to top in the order mentioned,
wherein the capacitor lower electrode is electrically connected to said connection contact.

19. The device according to claim 18, wherein lower electrodes of memory cells, each of which includes said select transistor, said antifuse and said capacitor, are electrically connected to a common plate line.

20. The device according to claim 18, further comprising a controller for exercising control in such a manner that when a write operation is performed, the semiconductor substrate and lower electrode are placed at ground potential and a positive potential higher than the potential applied to the drain region is applied to the gate electrode, after which potentials of the drain region and gate electrode are lowered and a positive potential is applied to the capacitor upper electrode.

21. The device according to claim 1, wherein the width of the side wall is a horizontal interval from 10 nm to 50 nm.

22. The device according to claim 1. wherein each of said antifuses comprises a MOS (metal-oxide semiconductor) half-transistor structure or a MOS transistor structure.

23. The device according to claim 1, wherein the single interlayer insulating film is formed to cover said select transistor and said antifuse, including an exposed part of the source/drain regions, and
wherein the connection contact is buried in a hole formed in the interlayer insulating film.

* * * * *